(12) United States Patent
Stevens et al.

(10) Patent No.: US 6,678,876 B2
(45) Date of Patent: Jan. 13, 2004

(54) PROCESS AND APPARATUS FOR FINDING PATHS THROUGH A ROUTING SPACE

(75) Inventors: Mac Stevens, San Jose, CA (US); Yves Parent, San Francisco, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/938,789

(22) Filed: Aug. 24, 2001

(65) Prior Publication Data

US 2003/0070153 A1 Apr. 10, 2003

(51) Int. Cl.[7] ............................................. G06F 17/50
(52) U.S. Cl. ............................. 716/12; 716/13; 716/14
(58) Field of Search ..................................... 716/1–14

(56) References Cited

U.S. PATENT DOCUMENTS

| | | | | |
|---|---|---|---|---|
| 4,500,963 A | * | 2/1985 | Smith et al. .................. 716/9 |
| 4,642,890 A | * | 2/1987 | Hechtman et al. ............ 29/846 |
| 5,245,550 A | * | 9/1993 | Miki et al. .................... 716/13 |
| 5,636,129 A | * | 6/1997 | Her .............................. 716/12 |
| 5,657,242 A | * | 8/1997 | Sekiyama et al. ............ 716/15 |
| 5,717,600 A | * | 2/1998 | Ishizuka ....................... 716/14 |
| 6,256,769 B1 | * | 7/2001 | Tamarkin et al. ............. 716/12 |
| 6,385,758 B1 | * | 5/2002 | Kikuchi et al. ............... 716/2 |
| 6,490,713 B2 | * | 12/2002 | Matsumoto ................... 716/12 |

OTHER PUBLICATIONS

Goering, "Altium Preps Topological Autorouter," EEdesign (Dec. 10, 2001), 3 pages.
CLAN Systems Ltd. PCB AutoRouter, 5 pages.
Hingston et al., "Topological Autorouting, Mapping the changing space," Altium Limited (2002), pp. 1–8.
"Single–layer automatic router," IBM Research, 3 pages.

* cited by examiner

*Primary Examiner*—Vuthe Siek
*Assistant Examiner*—Sun James Lin
(74) *Attorney, Agent, or Firm*—Stuart L. Merkadeau; N. Kenneth Burraston

(57) ABSTRACT

An initial graph of nodes is created within a routing space, and the number and locations of the nodes in the graph are adjusted. Links are created between nodes of the graph, and traces between specified nodes are created through the linked graph.

22 Claims, 27 Drawing Sheets

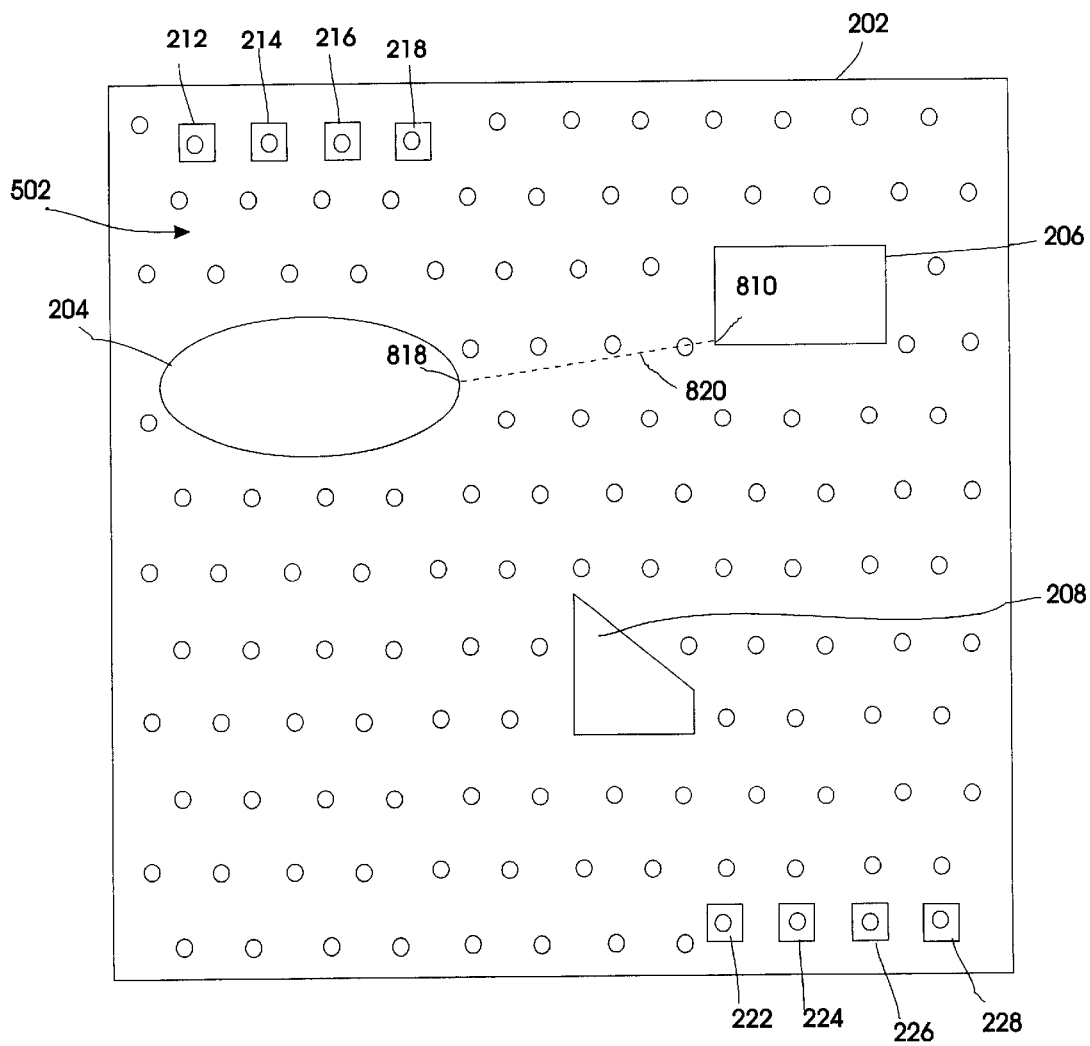

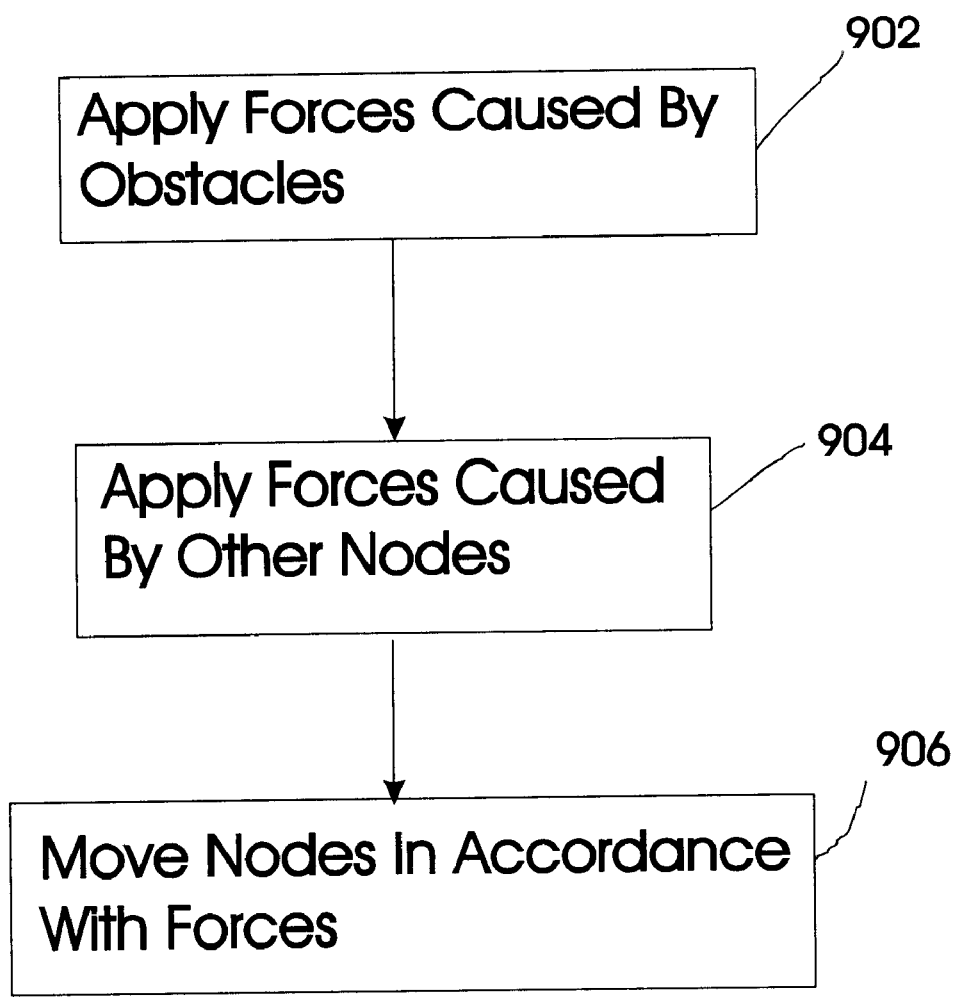

PROCESS AND APPARATUS FOR FINDING PATHS THROUGH A ROUTING SPACE

FIELD OF THE INVENTION

The present invention is generally directed to automated electronic design systems and, more particularly, to automated routing of traces or wiring in an electronics system.

BACKGROUND OF THE INVENTION

A typical electronics apparatus or system includes a plurality of components and electrical traces interconnecting the components. (The term "components" is used herein broadly to include any electrical circuit element (including without limitation integrated circuits, discrete circuit elements, and elements of an integrated circuit), any portion of such an electrical circuit element, and any electrically conductive element (including without limitation, electrically conductive vias, terminals, pads, etc.).) Examples of such electronic apparatuses or systems include, but are not limited to, printed circuit boards with electronic components mounted or formed thereon, probe cards for testing integrated circuits formed into a semiconductor wafer, and integrated electronic circuits, to name just a few.

A printed circuit board, for example, generally includes components such as integrated circuits, discrete electronics components, connectors for making electrical connections onto and off of the printed circuit board, vias, terminals, pads, etc. mounted or formed thereon. Electrical traces or wires must be formed on or within the printed circuit board to electrically connect various ones of the components.

Generally speaking, a probe card includes a printed circuit board, which is often circular. Components on the printed circuit board of a probe card may include such things as contacts for making electrical connections with a tester and contacts for making electrical connections with a probe head that ultimately makes electrical connections with test points on a semiconductor wafer. The printed circuit board may additionally include other components such as integrated circuits and discrete electronic components. Electrical traces must be formed on the printed circuit board to interconnect the tester contacts, the probe head contacts, and the other electrical components.

Again generally speaking, an integrated circuit consists of numerous electrical components integrated into a semiconductor material. Typically, the electrical components are transistors but may also include other electronic elements. The transistors and other electronic elements must be interconnected by traces of metal or other conductive materials formed typically in layers as part of the integrated circuit.

Regardless of the type of electronics apparatus or system (three nonexclusive examples of which have been mentioned above), the apparatus or system must be designed before it can be manufactured. Due to the increasing complexity of such electronic apparatuses and systems, computer aided engineering (CAE) or computer aided design (CAD) computer products have been developed to aid in the design of such apparatuses or systems. For example, such computer products may aid in the selection and arrangement of the electronic and mechanical components that compose the electronic apparatus or system. Some CAE or CAD computer products also aid in creating paths through the apparatus or system for the electrical traces that interconnect the electrical components of the apparatus or system. The present invention is directed to an improved computer product for automatically creating such paths.

SUMMARY OF THE INVENTION

The present invention is generally directed to automated routing of traces or wiring in an electronics system. In various embodiments of the invention, an initial graph of nodes is created within a routing space, and the number and locations of the nodes in the graph are adjusted. Links are created between nodes of the graph, and traces between specified nodes are created through the linked graph.

BRIEF DESCRIPTION OF THE DRAWINGS

FIGS. 8A–8F illustrate application of the process illustrated in FIG. 7 to an exemplary routing space.

FIG. 9 illustrates an exemplary process for adjusting the nodes of a graph.

DETAILED DESCRIPTION OF EMBODIMENTS OF THE INVENTION

The present invention is generally directed to automated routing of traces or wiring in an electronics system. The following specification describes several exemplary embodiments and applications of the invention. The invention, however, is not limited to these exemplary embodiments and applications or to the manner in which the exemplary embodiments and applications operate or are described herein.

As used herein, "electronics system" refers to any product, apparatus, or system (or portion thereof) that comprises a plurality of interconnected electronic components. As mentioned above, nonexclusive examples of such electronics "systems" include a printed circuit board with electronics mounted thereon, a probe card, and an integrated circuit. In all such systems, conductive traces, vias, and/or wiring (hereinafter referred to as "traces") must be formed to interconnect the various electronic components. Usually, the traces may not overlap and must be formed a minimum distance from each other and other system obstacles. Depending on the particular electronics system, it may be advantageous for such traces to be as short as possible or of uniform length. Such an electronics system typically includes obstacles, zones, or areas through which the traces may not be routed. Such obstacles, zones, or areas are referred to herein as "obstacles."

Figure 1:
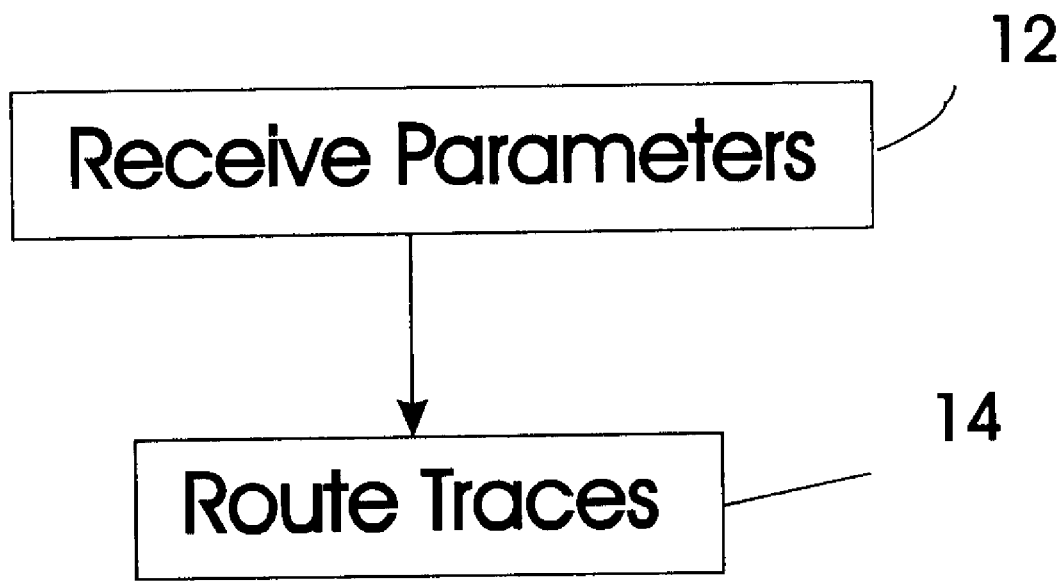
FIG. 1 illustrates an exemplary embodiment of the invention.

FIG. 1 illustrates an exemplary embodiment of the invention, which is intended to create paths for traces or wiring in an electronics system. As shown in FIG. 1, parameters are received at step 12. The parameters are in computer readable format and include data that will be used in performing subsequent steps. Such parameters may include without limitation a description of the portion of the electronics system in which traces are to be routed, a list of the components that must be electrically connected by traces, and design rules that the traces must adhered to.

Figure 2:
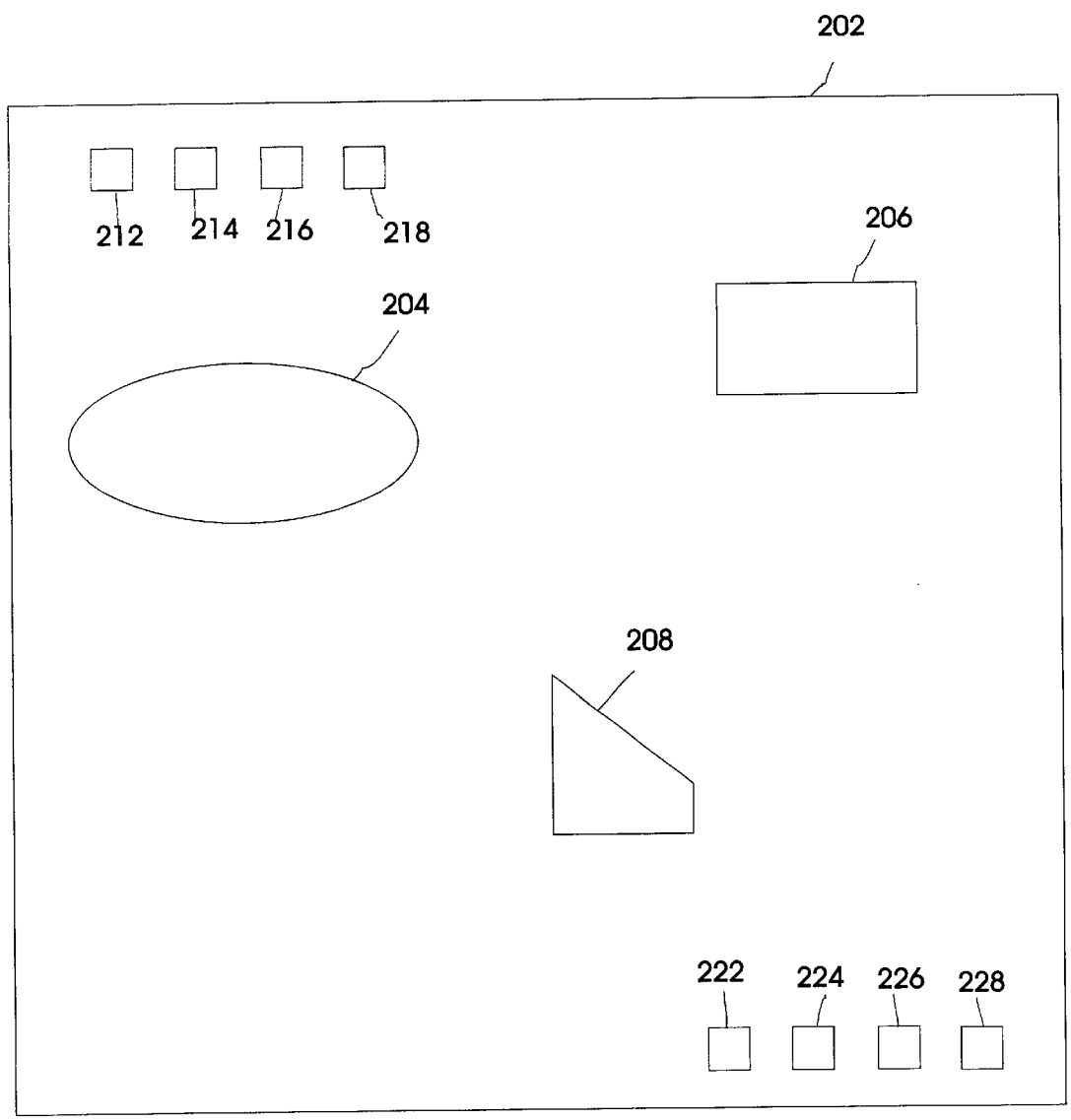
FIG. 2 illustrates an exemplary routing space with obstacles and components.

FIG. 2 depicts an exemplary routing area 202 in an electronics system (not shown). The exemplary routing area 202 includes electronic components 212, 214, 216, 218, 222, 224, 226, 228 and obstacles 204, 206, 208. As mentioned above, nonexclusive examples of electronics systems include printed circuit boards with electronics mounted thereon, probe cards, and integrated circuits. Thus, the routing area 202 may represent without limitation all or a portion of a printed circuit board, a probe card, or an integrated circuit. In the example illustrated in FIG. 2, one or more of electronic components 212, 214, 216, 218 are to be interconnected with one or more of electronic components 222, 224, 226, 228. Thus, one or more traces must be formed between electronic components 212, 214, 216, 218 and components 222, 224, 226, 228. Obstacles 204, 206, 208 represent areas through which the traces may not pass. It should be apparent that the routing area 202 need not be square or rectangular but may be any shape. Indeed, probe cards are typically circular, in which case, the routing area of a probe card may also be circular. The components 212, 214, 216, 218, 222, 224, 226, 228 may be treated as obstacles.

Figure 3:
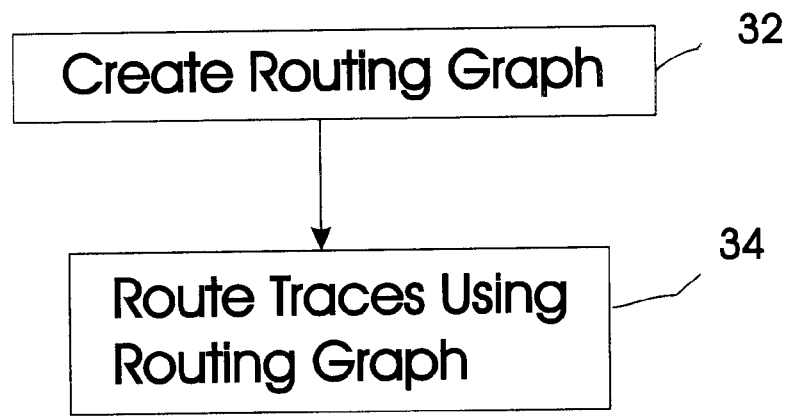
FIG. 3 illustrates an exemplary process for performing step 14 of FIG. 1.

Referring again to FIG. 1, once the parameters have been received at step 12, traces connecting the interconnected electronic components of the electronics system are created at step 14. FIG. 3 illustrates an exemplary process for routing the traces. As shown in FIG. 3, this exemplary process includes creating a routing graph 32 within the routing space and then using the routing graph to create the traces 34. As used herein, the term "graph" refers to any pattern, including without limitation a regular, irregular, or semi-irregular pattern of points, nodes, vertexes, or the like.

Figure 4:
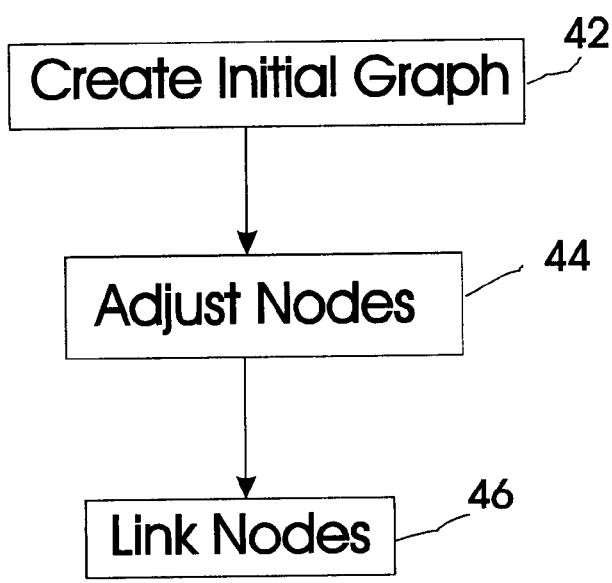
FIG. 4 illustrates an exemplary process for performing step 32 of FIG. 3.

FIG. 4 illustrates an exemplary process for creating a routing graph 32. As shown in FIG. 4, an initial graph is created 42. The initial graph comprises an initial pattern of points, nodes, or vertexes (hereinafter referred to as "nodes"). As will be seen, these nodes define possible paths for traces.

Figure 5:
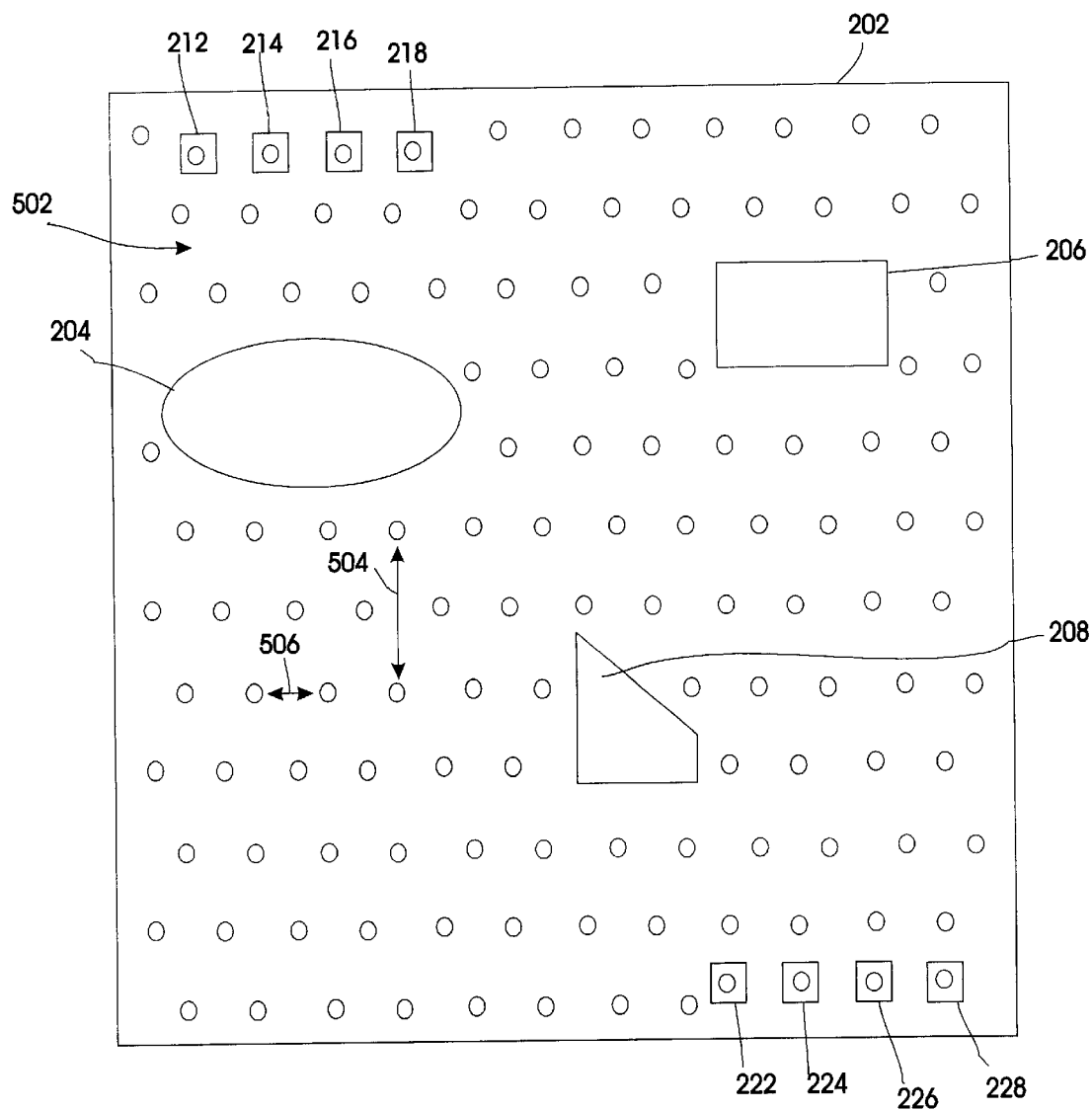
FIG. 5 illustrates an exemplary routing space to which an initial graph of nodes has been applied.

FIG. 5 illustrates an exemplary initial graph of nodes 502 created in the routing space 202 illustrated in FIG. 2. As can be seen, the exemplary pattern of nodes 502 shown in FIG. 5 consists of regularly spaced rows of regularly spaced nodes in which alternating rows are offset from one another horizontally as shown. The nodes 502 thus form a diamond or honeycombed patterned. The vertical spacing and horizontal spacing of the node pattern is not critical to the invention, and any desired spacings may be selected. The spacings may be related to the design rules the traces must follow. (The design rules are among the parameters received at step 12 in FIG. 1, and refer generally to rules specifying such things (without limitation) as the maximum and minimum widths of the traces, the minimum spacing required between a trace and an obstacle (the "trace-to-obstacle clearance" or "trace-to-via clearance"), and the minimum spacing between different traces (the "trace-to-trace clearance").)

For example, it has been found that the following spacings may be used advantageously with the pattern illustrated in FIG. 5: the vertical spacing 504 between nodes in a column of the graph illustrated in FIG. 5 may be twice the sum of the maximum trace width plus the minimum trace-to-trace clearance, and the horizontal spacing 506 between nodes in a row of the graph may be the vertical spacing 504 divided by the square root of three (3). Although the nodes are illustrated in FIG. 5 as circles for clarity, the nodes are preferably treated as points (e.g., the centers of the circles). Throughout the discussions in this specification, nodes will be treated as points (e.g., at the center of a circle), even though the nodes are depicted as circles for clarity in the drawings.

No particular pattern of nodes 502, however, is required, and any pattern may be used. Nonexclusive examples of other patterns that may be used include without limitation concentric circles or other shapes of nodes and aligned columns and rows of nodes. Of course, the more regular the pattern, the easer it is to form the pattern. It is believed, however, that irregular patterns or quasi-irregular patterns reduce the tendency for trace segments to align with given directions inherent to the graph and, therefore, are preferable.

An example of an irregular pattern is one in which the location of each node is randomly generated. An example of a quasi-irregular pattern is a regular pattern in which a path connecting more than a few (e.g., three) adjacent nodes cannot be straight. Another example of a quasi-irregular pattern involves irregularly orienting a plurality of regular patterns with respect to each other. For example, a plurality of regular seven-node patterns consisting of six nodes located at the corners of a six-sided polygon with the seventh node located at the center of the polygon has been used to generate a quasi-irregular pattern by orienting the polygons irregularly with respect to one another.

The following formula describes such a pattern. In this formula s is trace spacing, preferably equal to trace width plus trace-to-trace clearance; a and b are integers of unlimited range; r is a radius, taking one of two values; p is an integer from 0 to 5, inclusive; θ is an angle in radians; x and y are Cartesian coordinates of a node.

$$a = \ldots -3, -2, -1, 0, 1, 2, 3, \ldots$$

$$b = \ldots -3, -2, -1, 0, 1, 2, 3, \ldots$$

$$r = 0, \frac{2}{\sqrt{3}}s$$

$$p = 0, 1, 2, 3, 4, 5$$

$$\theta = \left(\frac{a}{9} + \frac{p}{3}\right)\pi$$

$$x = \left(1 + \frac{\sqrt{3}}{4}\right)sa + r\cos\theta$$

$$y = (4 + \sqrt{3})s\left(b + \frac{a}{2}\right) + r\sin\theta$$

Of course, many variations and other patterns are possible.

Although nodes overlapping components 212, 214, 216, 218, 222, 224, 226, 228 and obstacles 204, 206, 208 are not included in the exemplary pattern shown in FIG. 5, nodes that overlap the components and obstacles could be included. If such overlapping nodes are included, data indicating that the nodes are not useable could be stored by the process illustrated in FIG. 1. Alternatively, the graph of nodes 502 illustrated in FIG. 5 could initially be created with nodes that overlap the components and the obstacles, and thereafter, the overlapping nodes could be deleted. In addition, nodes that do not overlap an obstacle but nevertheless are closer to an obstacle than a threshold distance, such as the minimum obstacle-to-trace clearance, may be treated in the same way as nodes that overlap an obstacle. As seen in FIG. 5, the graph preferably includes nodes placed on at least the components (e.g., 212, 214, 216, 218, 222, 224, 226, 228) that will be the beginning or end of a trace.

Referring again to FIG. 4, adjustments are made to the nodes of the graph at step 44. One exemplary way of adjusting the nodes is to add additional nodes between obstacles. As will be seen, this may provide the advantage of defining additional possible paths for traces between or around obstacles.

Figure 6:
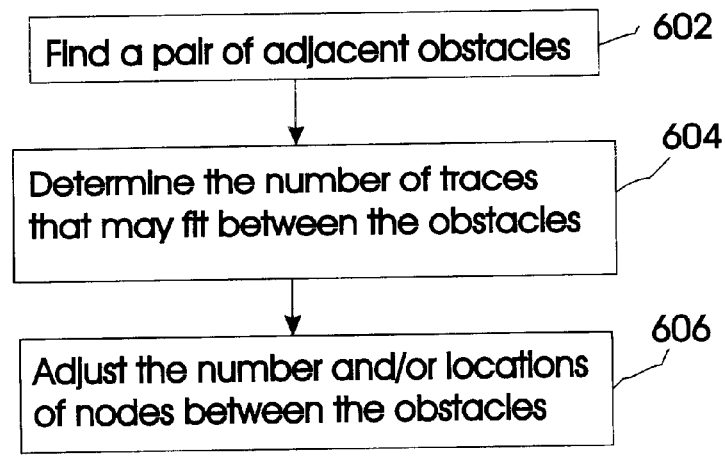
FIG. 6 illustrates an exemplary process for adjusting the nodes of an initial graph.

FIG. 6 illustrates one exemplary process for adjusting the nodes 502 located between obstacles. As shown in FIG. 6, a pair of adjacent obstacles are identified 602. Next, the process determines the maximum number of traces that may fit between the obstacles 604. One way to do so is to determine or estimate the distance between the obstacles. Then, using design rule data specifying the minimum separation between adjacent traces and the minimum separation between an obstacle and a trace, the maximum number of traces that can pass through the space between the obstacles is calculated. Thereafter, the node pattern between the obstacles is adjusted to ensure that the nodes between the obstacles define possible paths through the area between the obstacles that correspond to the maximum number of traces that may fit between the obstacles. The node pattern may also be adjusted to increase and/or maximize the possible pathways the traces could take in passing between the obstacles. The process of FIG. 6 may be repeated for each pair of adjacent obstacles in the routing space.

Figure 7:
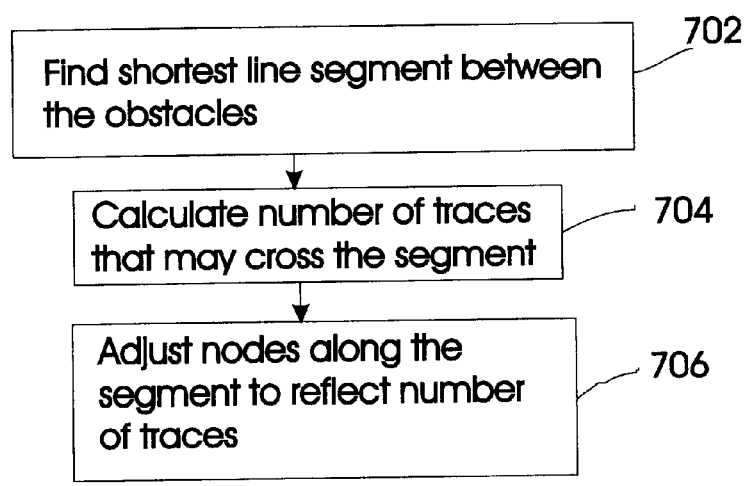
FIG. 7 illustrates an exemplary process for performing steps 604 and 606 of FIG. 6.

FIG. 7 illustrates an exemplary process for performing steps 604 and 606 of FIG. 6. As shown in FIG. 7, the shortest line segment or an approximation of the shortest line segment between the two obstacles is located at step 702. The particular method used to determine or approximate the shortest line segment between the two obstacles is not critical to the present invention. Indeed, a person of ordinary skill in the field could devise many methods to determine or approximate the shortest line segment, and any such method may be used with the present invention.

Figure 8A:
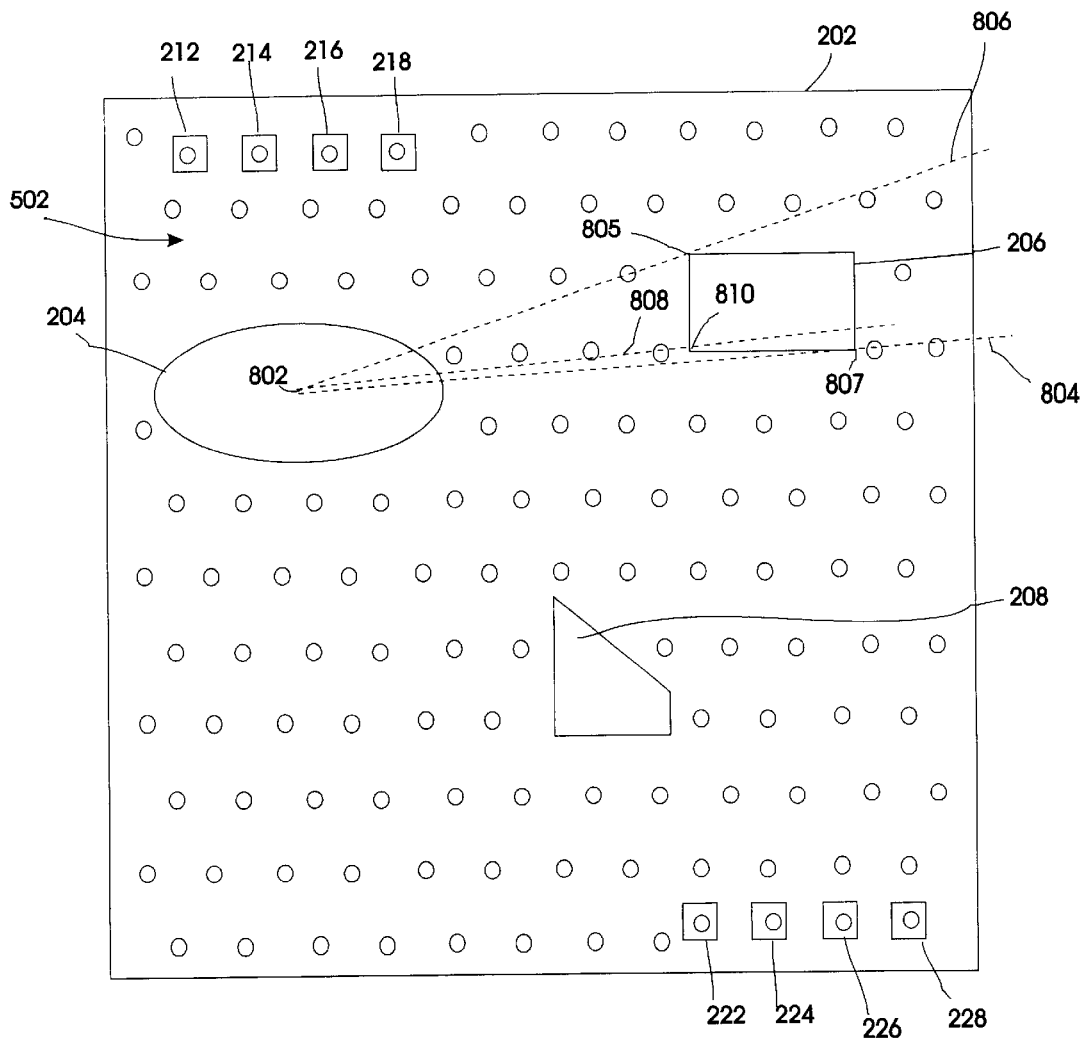
Figure 8B:
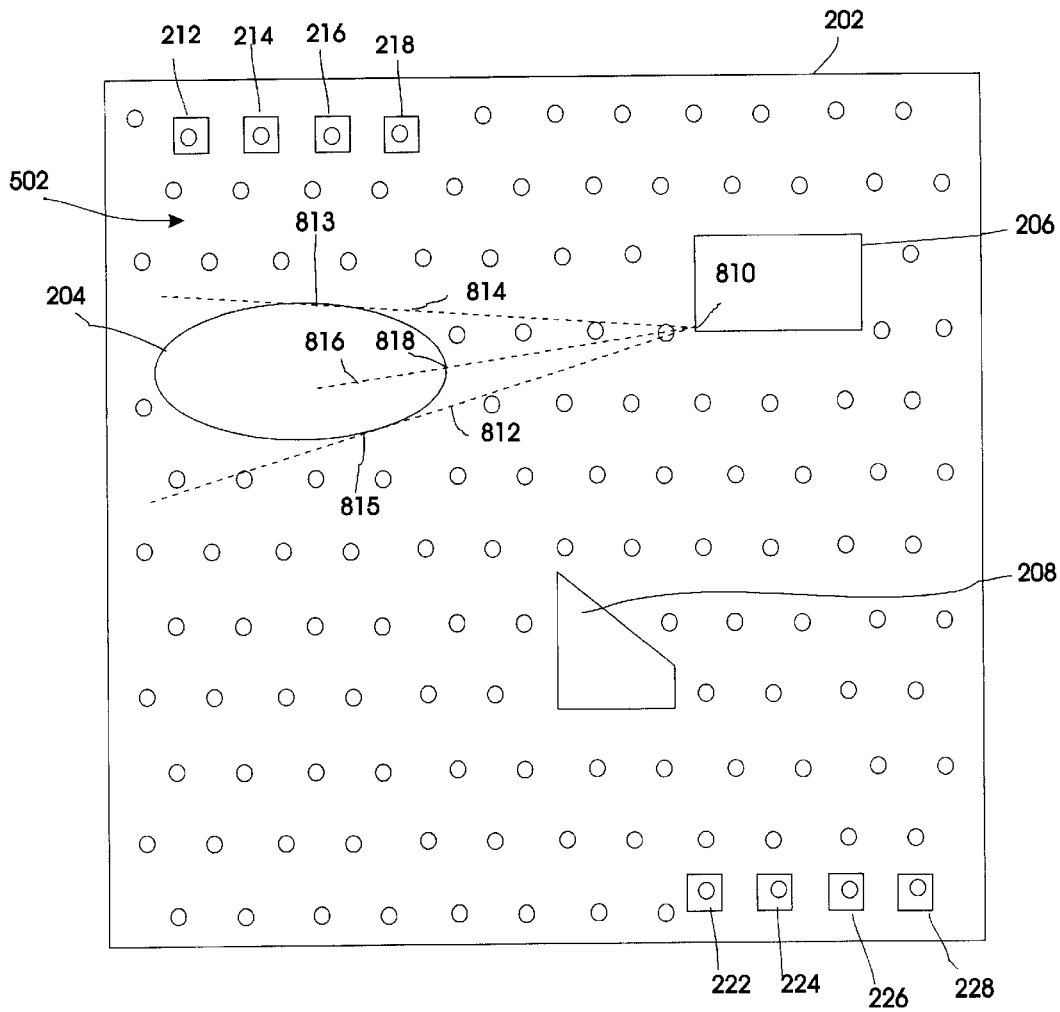

FIGS. 8A–8C illustrate one exemplary method for determining or approximating the shortest line segment between obstacle 204 and obstacle 206 in routing space 202. FIG. 8A illustrates finding a point 810 on the perimeter of obstacle 206 that is the shortest or approximately shortest distance from a center (or centroid) 802 of obstacle 204. As shown in FIG. 8A, one way of finding point 810 is first to find two lines 804 and 806 that pass through the center 802 of obstacle 204 and are tangential to object 206. Note that line 806 is tangential to obstacle 206 at point 805, and line 804 is tangential to obstacle 206 at point 807. All possible lines that pass through center 802 and intersect obstacle 206 lie between these two tangential lines 804, 806. Once these lines 804, 806 are found, line 808 may be found (or approximated) by determining the distance between the center 802 of obstacle 204 and an intersection with obstacle 206 of various lines that pass through center 802, intersect obstacle 206, and lie between lines 804, 806. As shown in FIG. 8A, line 808 is the line with the shortest distance between the center 802 of obstacle 204 and the intersection point with obstacle 206. Thus, the point at which line 808 intersects obstacle 206 is the closest point on obstacle 206 to the center 802 of obstacle 204, and that point is labeled 810 in FIG. 8A.

FIG. 8B illustrates finding a point 818 on the perimeter of obstacle 204 that is the shortest or approximately shortest distance from point 810 on obstacle 206. As shown, one way of finding point 818 is first to find two lines 812 and 814 that pass through point 810 on obstacle 206 and are tangential to object 204. Note that line 812 is tangential to obstacle 204 at point 815, and line 814 is tangential to obstacle 204 at point 813. All possible lines that pass through point 810 on obstacle 206 and intersect obstacle 204 lie between these two tangential lines 812, 814. Once these lines 812, 814 are found, line 816 may be found (or approximated) by determining the distance between the point 810 on obstacle 206 and an intersection with obstacle 204 of various lines that pass through point 810, intersect obstacle 204, and lie between lines 812, 814. As shown in FIG. 8B, line 816 is the line with the shortest distance between point 810 on obstacle 206 and the intersection point with obstacle 204. The point 818 at which line 816 intersects obstacle 204 is or approximates the closest point on obstacle 204 to point 810 on obstacle 206.

Referring now to FIG. 8C, line segment 820 is a segment of line 816 between points 810 and 818. It has been found that this line segment 820 typically is or at least approximates the shortest distance (or line segment) between obstacles 204 and 206.

Referring again to FIG. 7, once the shortest (or approximately) shortest line segment is found between the two obstacles at step 702, the number of traces that may pass between the obstacles is calculated at step 704. One exemplary method for performing this step is as follows. To provide clearance between traces and the obstacles, two times the minimum obstacle-to-trace clearance is subtracted from the length of line segment 820. Then, the maximum width of one trace is further subtracted from the above difference. The minimum obstacle-to-trace clearance and the maximum width of a trace are data received at step 12 of FIG. 1. Next, the resulting difference is divided by the sum of the maximum allowable trace width and the minimum trace-to-trace clearance. The maximum trace width defines the maximum allowable width of any trace, and the minimum trace-to-trace clearance defines the minimum separation of all traces within routing space 202. Again, such data is received at step 12 of FIG. 1. The result of this division is rounded down to the nearest integer value and then incremented by one. The result represents the maximum number of traces that can pass between obstacles 204 and 206.

Figure 8D:
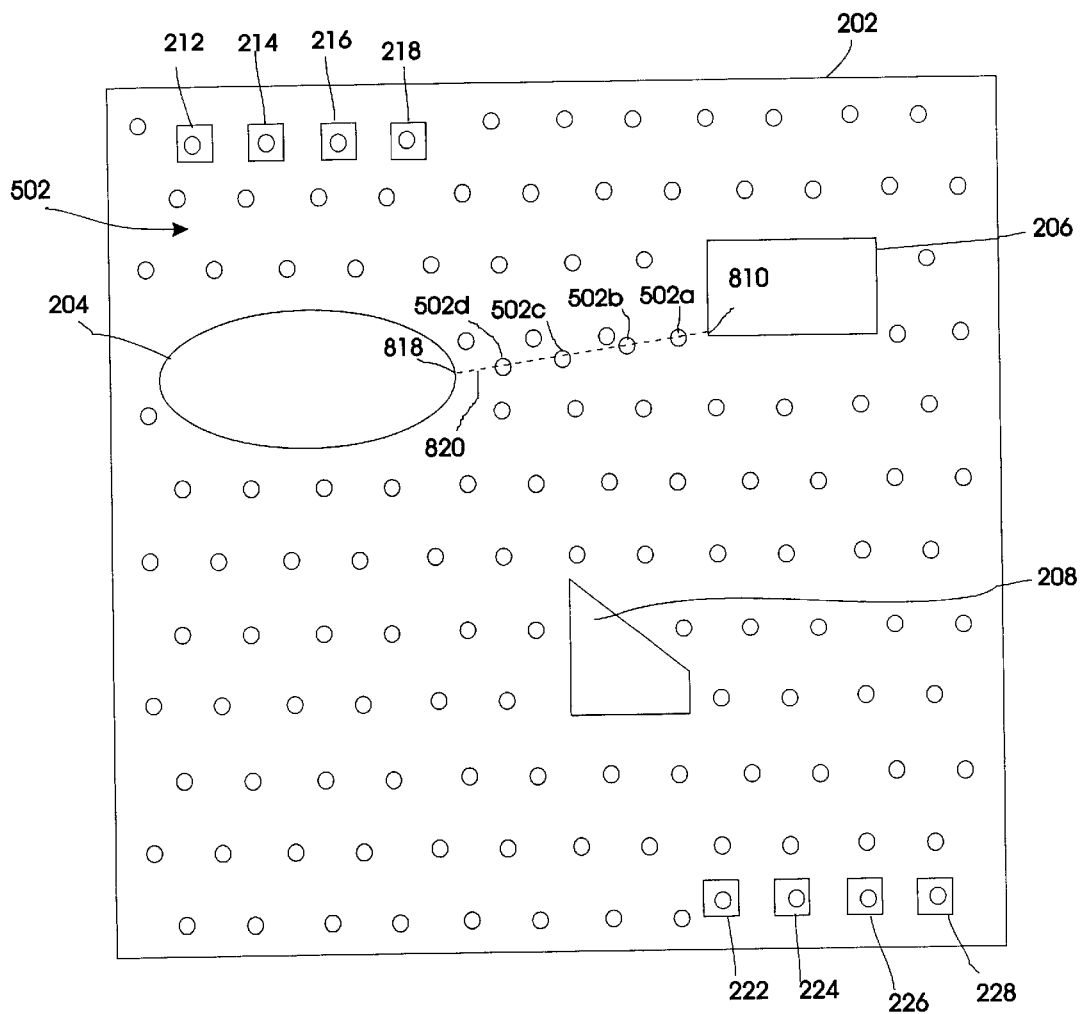

Once the number of traces that may cross the line segment representing the shortest distance or an approximation of the shortest distance between the obstacles has been determined at step 704, the node pattern between the obstacles is adjusted 706. FIG. 8D illustrates an exemplary way of adjusting the node pattern. In the example illustrated in FIG. 8D, it is assumed that the calculation performed at step 704 resulted in a determination that four traces may pass between obstacles 204 and 206. This being the case, the node pattern between obstacles 204 and 206 is adjusted so that four nodes lie along line segment 820. In the example illustrated in FIG. 8D, only one preexisting node 502a (created at step 42 of FIG. 4) lies along line segment 820. Thus, three new nodes 502b, 502c, 502d are added along line segment 820.

There are many possible patterns in which the four nodes 502a, 502b, 502c, 502d may be arranged along line segment 820. For example, the preexisting node 502a may be left in its original position and new nodes 502b, 502c, 502d may be evenly spaced between node 502a and point 818 on obstacle 204. Alternatively, preexisting node 502a may be moved as necessary so that all four nodes 502a, 502b, 502c, 502d are evenly spaced along line segment 820. As yet another alternative, the nodes closest to an obstacle, nodes 502a and 502d, may be spaced from their nearest obstacle by a distance equal to the minimum trace-to-obstacle spacing plus half the maximum trace width defined by the parameters received at step 12 of FIG. 1, and each of the four nodes spaced from its nearest neighbor node by the minimum trace-to-trace spacing as also defined by the parameters received at step 12. The foregoing are examples only, and are not to be taken as limiting.

In the case described above, there were fewer preexisting nodes on the line segment representing the shortest distance between two obstacles than the number of traces that can fit between the obstacles, and accordingly, additional nodes were added between the obstacles. If more preexisting nodes lie along or within a threshold distance of the line segment than the number of traces that can fit between the obstacles, then preexisting nodes may be removed from the line segment so that the number of nodes lying along or near the line segment equals the number of traces that can fit between the obstacles. Of course, these remaining nodes may be left in the original locations or may be spaced along the line segment as described above. If there is insufficient space between the obstacles for even one trace, all nodes may be removed from the line segment, or alternatively, one or more nodes may be left along the line segment or added along the line segment and then marked to indicate that the nodes may not be used in forming a route for a trace.

Figure 8E:
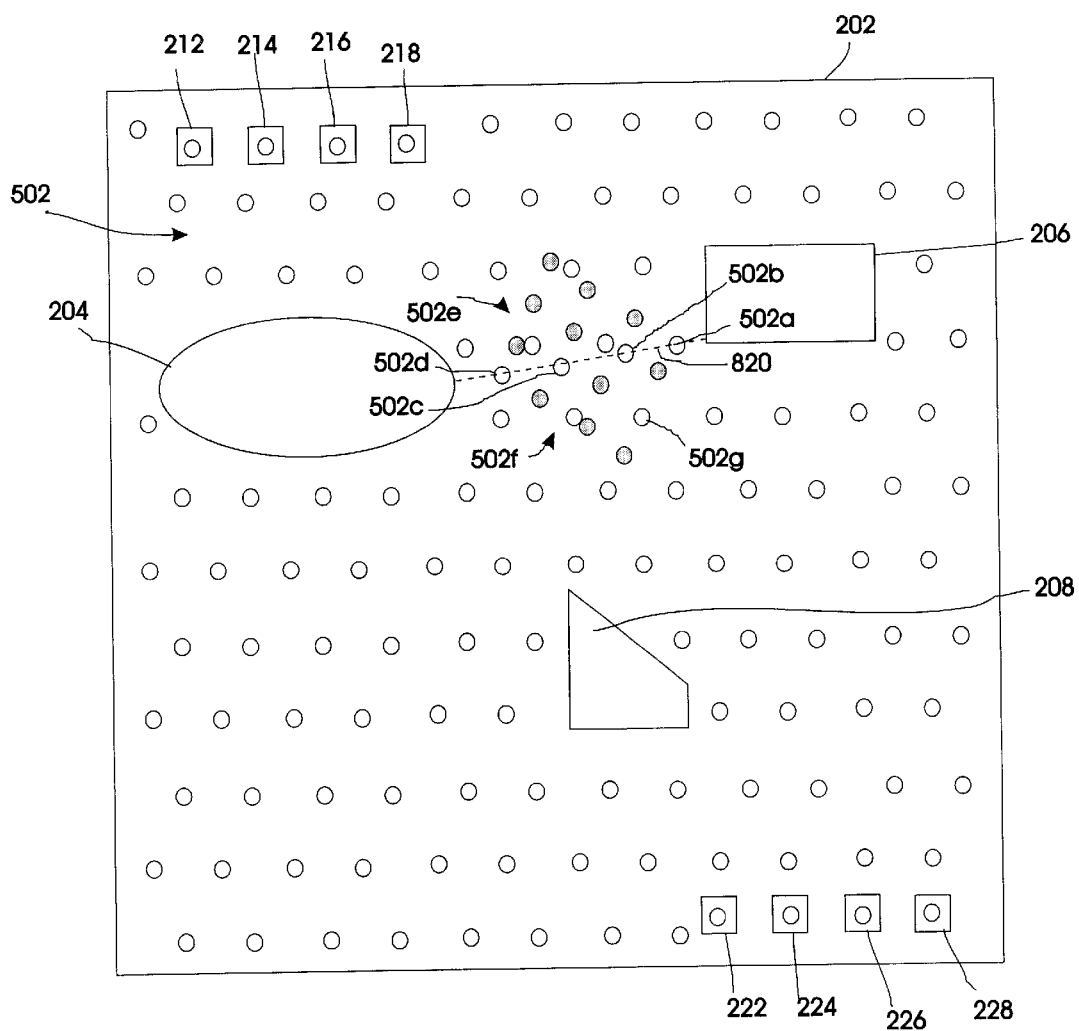

Although not shown as a step in FIG. 7, additional new nodes may optionally be added offset from the line segment 820 to define additional path options for traces. FIG. 8E illustrates the addition of a triangularly-arranged patterns of new nodes 502e, 502f offset from both sides of line segment 820. (These new nodes are highlighted in gray in FIG. 8E.) As shown, new nodes 502e are arranged in a triangular pattern and added above line segment 820. Likewise, new nodes 502f are arranged in a triangular pattern and added below line segment 820. A suitable spacing between the new nodes in the triangular patterns 502e and 502f is approximately the sum of the maximum trace width plus the minimum trace-to-trace clearance, which was received at step 12 of FIG. 1. Other spacings, however, may be used with the present invention.

It should be noted that, in the example illustrated in FIG. 8E, preexisting node 502g (created at step 42 of FIG. 4) would overlap or lie too close to one of the new nodes in the triangular pattern 502f added below line segment 820. In the example shown in FIG. 8E, the overlapping new node is not added or is deleted immediately after it is added.

As noted above, the addition of new node patterns 502e and 502f is optional. Moreover, the triangular-pattern of new node patterns 502e and 502f is exemplary only. Other patterns of new nodes could be added above and/or below the line segment 820.

The above described process of finding the shortest or approximately shortest line segment between two obstacles is not the exclusive way in which nodes may be added between obstacles. Rather, than the process described above, other methods of creating a line segment between obstacles can be used with the present invention. For example, a line could be created between the centers or centroids of the two obstacles, and the line segment between the two points along such a line that intersect the two obstacles could be used in place of the line segment 820 above. Alternatively, a line segment between any two points on the two obstacles could be used in place of the line segment 820.

Although the above-described processes create only one line segment between the two obstacles, more than one line segment could be created between the obstacles, and new nodes could be added along and/or around such additional line segments as described above. For example, in addition to line segment 820 described above with respect to FIG. 8C, additional line segments could be created between points 805 and 813, on one hand, and points 807 and 815, on the other hand.

Figure 8F:
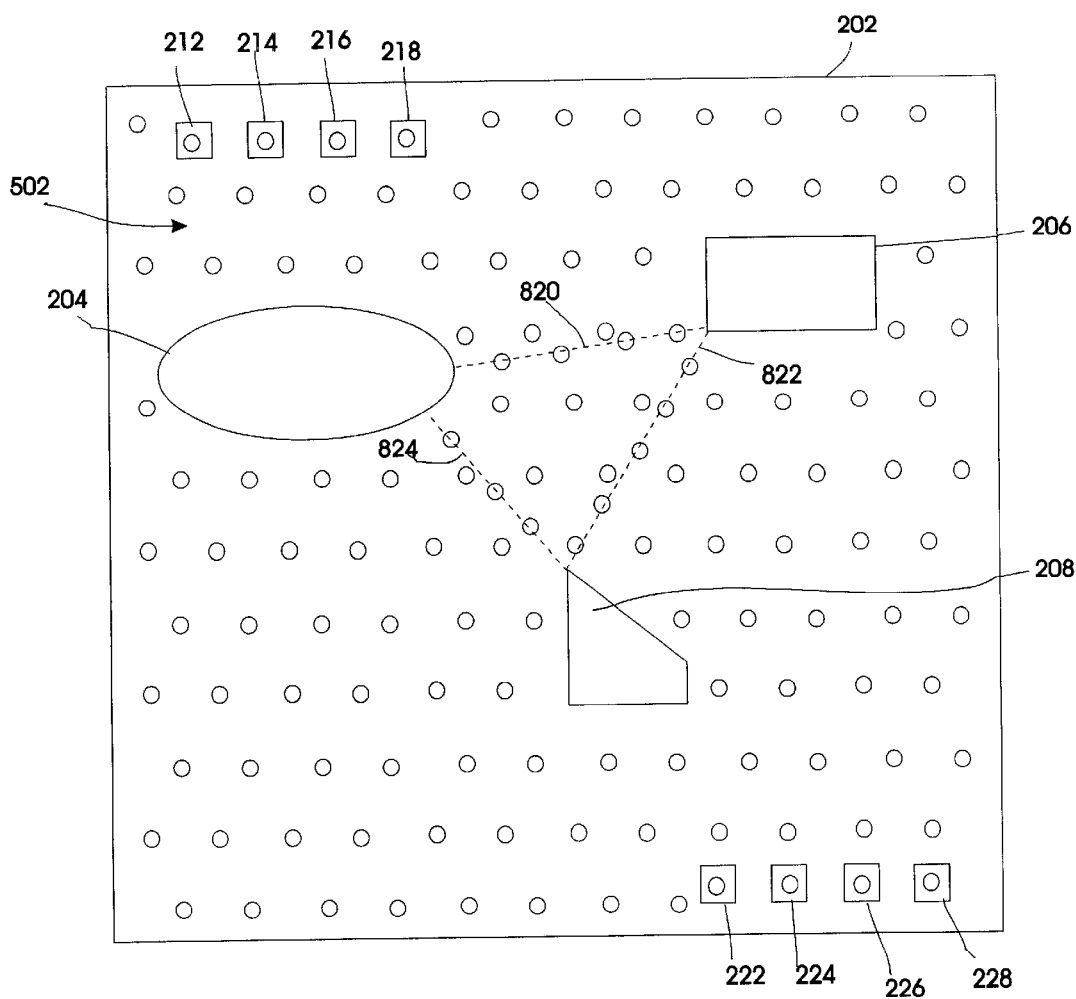

Referring again to FIGS. 4 and 6, once the process of FIG. 6 has been completed, the nodes of the initial graph have been adjusted (step 44 in FIG. 4) by adding additional nodes (or deleting existing nodes) between a pair of obstacles as shown in FIGS. 8D and 8F. The process illustrated in FIG. 6 may be repeated for every pair of adjacent obstacles in the routing space. FIG. 8F illustrates the addition of new nodes along line segment 822 between obstacles 206 and 208 and line segment 824 between obstacles 204 and 208. Such new nodes may be added in accordance with the process discussed above with respect to FIGS. 7 and 8A–8D. For the sake of simplicity and ease of discussion, the triangular patterns of new nodes 502e and 502f are not shown in FIG. 8F, nor are any such patterns shown around line segments 822 or 824. It should be apparent, however, that such new nodes may be added to the exemplary routing space shown in FIG. 8F.

FIG. 9 illustrates a further process that may optionally be performed as part of the process of executing step 44 of FIG. 4—adjusting the nodes. The process shown in FIG. 9 applies forces to each node based on nearby obstacles (e.g., obstacles and other nodes) 902, 904. The process then moves the nodes based on the applied forces 906. The process may be repeated one or more times. The aim of the process of FIG. 9 is to create a smoother distribution of nodes within the routing area and to improve the likelihood that the initial routing of traces through the routing space conforms with applicable design rules.

Figure 10A:
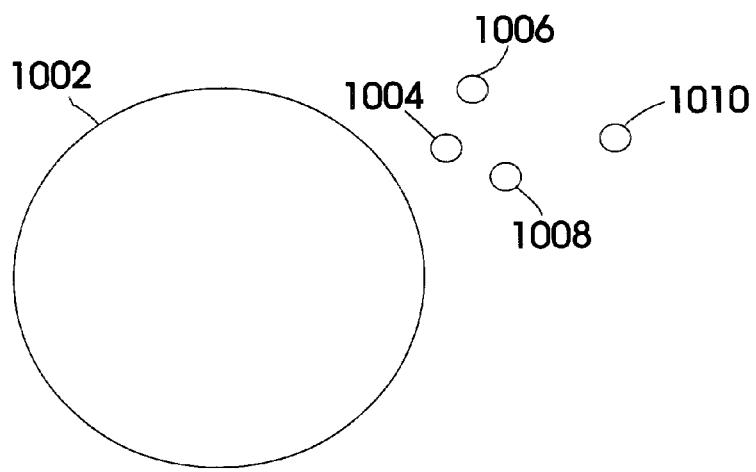
FIGS. 10A–10G illustrate application of the process of FIG. 9 to an exemplary graph of nodes.
Figure 10B:
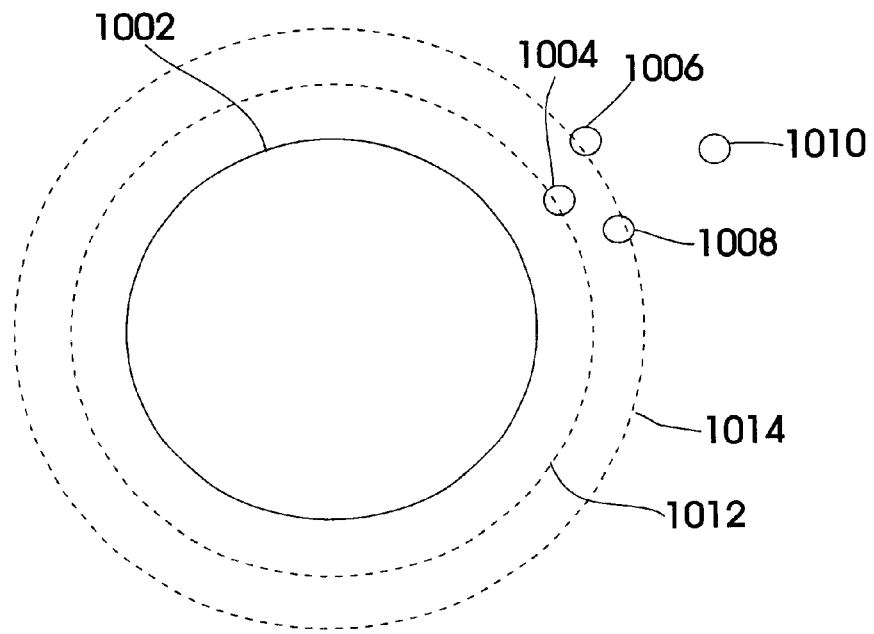
Figure 10C:
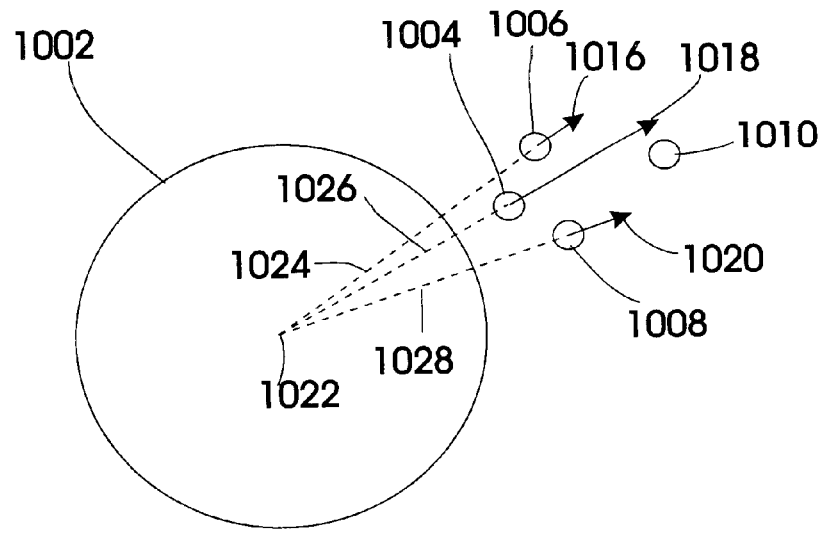

FIG. 10A illustrates an obstacle 1002 and four nodes 1004, 1006, 1008, 1010 in a routing space (not designated in FIG. 10A), and FIGS. 10B and 10C illustrate an exemplary application of forces to the four nodes 1004, 1006, 1008, 1010 due to their proximity to obstacle 1002 in accordance with step 902 of FIG. 9.

As shown in FIGS. 10B and 10C, two zones surrounding obstacle 1002 have been defined. The first zone 1012 defines a space immediately surrounding obstacle 1002. The first zone typically defines an area through which a trace may not pass. Such an area typically corresponds to the minimum obstacle-to-trace distance received at step 12 of FIG. 1. The second zone 1014 defines a space immediately surrounding the first zone 1012. It should be noted that the invention is not limited to use of two zones as illustrated in FIG. 10B. Only one zone may be used, or more than two zones may be used. That is, only zone 1012 may be used, or additional zones may be defined around zone 1014.

Regardless of the number of zones defined around the obstacle, a force is assigned to each zone. Generally speaking, the size or amount of each force is chosen so as move a node a given distance within the routing space. Selection of specific force sizes and directions is not critical to the invention, although the forces should tend to enforce design rules. For example, it may be preferable to define the force assigned to zone 1012 above as being sufficient to move a node all or some fraction of the width of zone 1012. Thus, for example, if the force is sized to move a node the entire width of zone 1012, all nodes falling within zone 1012 would be moved out of the zone after one application of forces to the nodes (ignoring other forces that might be applied to the nodes). On the other hand, if the force is sized to move a node half the width of zone 1012, a node falling within zone 1012 may or may not be moved out of the zone after one application of forces to the nodes, but all such nodes would be moved out of the zone after two applications of forces to the nodes (again ignoring other forces that might be applied to the nodes).

Similar considerations to those described above may be utilized to assign a force to zone 1014. In the above example, however, a trace passing through zone 1014 does not violate design rules. Consequently, it will generally be preferably to size a force assigned to zone 1014 to be smaller than other forces that might be assigned to the nodes.

One force magnitude may be assigned to a node regardless of its location within a zone. Alternatively, the magnitude of a force assigned to a node may vary depending on the location of the node within a zone. For example, a node falling near the border between zone 1012 and 1014 in FIG. 10B may be assigned a force with less magnitude than a node falling near the obstacle 1002 within zone 1012.

It should be noted that nodes that overlay the obstacle itself may be deemed to fall within the first zone 1012 and assigned a force corresponding to the first zone. Alternatively, the boundaries of the obstacle may be deemed yet another zone, and a force or range of forces assigned to it in the same manner as a force or range of forces is assigned to the first and second zones, as described above.

It should be apparent that the direction of a force may be determined in many different ways. For example, with a circular object such as the exemplary object 1002 illustrated in FIG. 10A, all forces may be in a direction that begins at the center of the obstacle and passes through the node to which the object is applied. For other shaped obstacles, forces may likewise emanate in a direction beginning at the center or the object, or alternatively, at the centroid of the obstacle. Many other possibilities exist. For example, as will be discussed below with respect to FIGS. 5A-5E, forces may be directed perpendicular to an edge of a polygon-shaped obstacle and/or the forces may be in a direction that bisects an angle formed by a corner of the polygon. Alternatively, the forces may be directed at a specified angle to an edge of a polygon-shaped obstacle. These and other direction schemes may be implemented with the present invention.

As shown in FIG. 10B, node 1004 falls at least partially within the first zone 1012. Nodes 1006 and 1008 do not fall within the first zone 1012 but fall at least partially within the second zone 1014. (It should be noted that, if the nodes are treated as points (e.g., located at the center of the circles depicting the nodes in FIG. 10B), the nodes either fall in or out of a zone. In this example, it is assumed that, if the nodes 1004, 1006, and 0118 are treated as points, node 1004 falls within the first zone 1012, and nodes 1006 and 1008 fall within the second zone 1012.) Node 1010 does not fall within the first zone 1012 or the second zone 1014.

As shown in FIG. 10C, a force 1018 associated with zone 1012 is applied to node 1004 because it falls within the first zone 1012. As also shown in FIG. 10C, forces 1016 and 1020 associated with the second zone 1014 are applied to nodes 1006 and 1008, respectively, because each falls within the second zone 1014. In this example, forces assigned to a zone are uniform regardless of where a node falls within the zone; the direction of the forces is along a line beginning at the center 1022 of obstacle 1002 and passing through the node to which the force is assigned; and the force associated with zone 1014 is significantly smaller than the force associated with zone 1012. Because node 1010 does not fall within the first zone 1012 or the second zone 1014, no force is applied to node 1010.

Figure 10D:
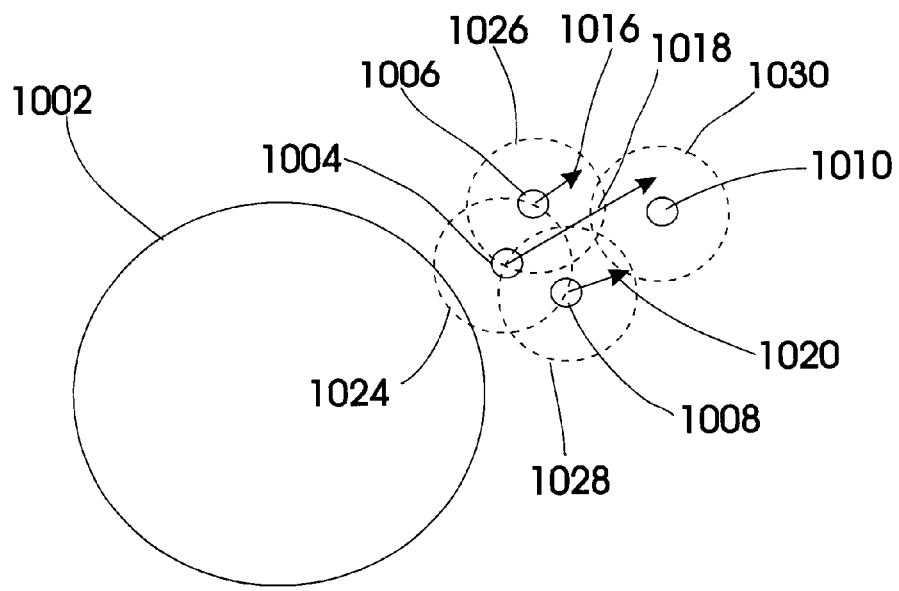
Figure 10E:
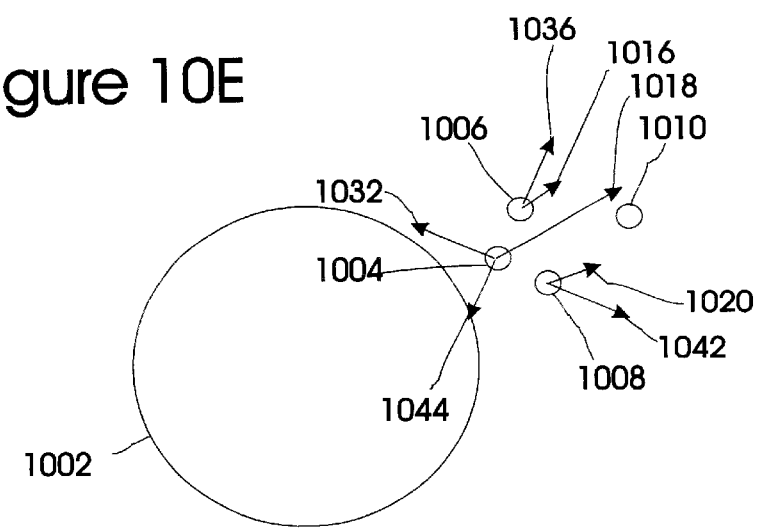

FIGS. 10D and 10E illustrate an exemplary application of forces to the four nodes 1004, 1006, 1008, 1010 due to their proximity to each other in accordance with step 904 of FIG. 9. Dashed circles 1024, 1026, 1028, 1030 represent a predefined space around each node. Typically, the predefined space corresponds to the sum of the maximum allowable width of a trace plus the minimum trace-to-trace clearance, as specified in the data received at step 12 of FIG. 1. Thus, the predefined space corresponds to a separation of nodes sufficient to allow two traces to be routed through two immediately adjacent nodes while maintaining the minimum required trace-to-trace clearance.

As shown in FIG. 10D, node 1004 and 1006 are closer to each other than the minimum separation distance defined by spaces 1024 and 1026. Similarly, nodes 1004 and 1008 are closer to each other than the minimum separation distance defined by spaces 1024 and 1028. The separation between node pairs 1006–1008 and 1006–1010, and 1008–1010, however, is greater than the minimum distance defined by spaces 1026, 1028, and 1030. Thus, while node pairs 1004–1006 and 1004–1008 are too close to each other, node pairs 1006–1008, 1006–1010, and 1008–1010 are not too close. Consequently, as shown in FIG. 10E, forces 1036 and 1044 are applied to nodes 1006 and 1004, respectively, in opposite directions, tending to separate the nodes. Likewise, forces 1032 and 1042 are applied to nodes 1004 and 1008, respectively, in opposite directions, tending to separate the nodes. No such forces are applied to separate node pairs 1006–1008, 1006–1010, and 1008–1010.

As with the forces associated with zones surrounding an obstacle, the specific magnitudes of the forces applied to a node due to its proximity to another node are not critical to the invention, and any magnitude force may be utilized. Preferably, the magnitude of the force bears a relationship to the minimum trace-to-trace separation in the design rules. For example, the magnitude of the forces applied to separate two nodes may be sufficient to move the two nodes apart by all or a fraction of the minimum trace-to-trace clearance. In addition, as discussed above with respect to forces in zones 1012 and 1014, one magnitude force may be assigned to nodes found to be too close together regardless of the specific distance between the nodes, or alternatively, the magnitude of the force may vary with the distance between the nodes. Also, although the direction of the forces applied to separate two nodes shown in FIG. 10E are directions that are opposite each other for each force on each node, other directions may be assigned to the forces. In addition, although forces are assigned to both nodes of the pair of nodes found to be too close together in the example shown in FIG. 10E, the force could be applied to only one of the nodes in the pair.

Of course, multiple zones could be defined around the nodes shown in FIG. 10D just like multiple zones are defined around the obstacle illustrated in FIG. 10B, and different forces assigned to the different zones.

Figure 10F:
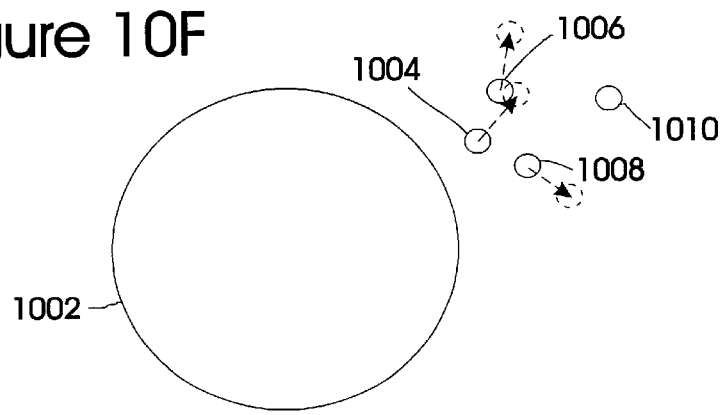
Figure 10G:
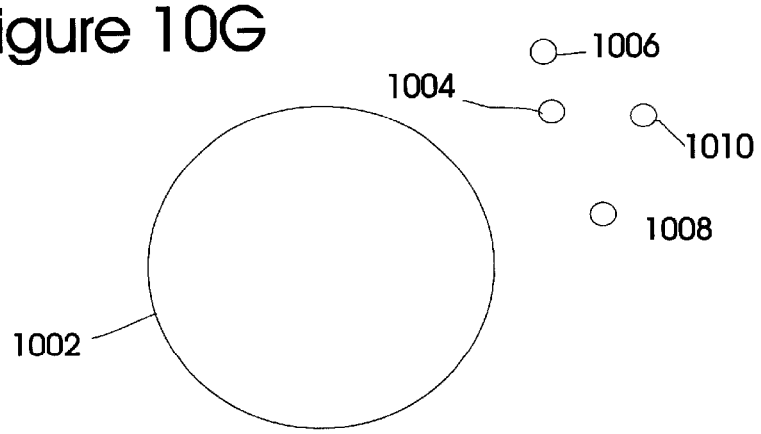

FIGS. 10F and 10G illustrate an exemplary movement of the nodes 1004, 1006, 1008, 1010 in accordance with the forces applied to those nodes as shown in FIGS. 10A–10E. As shown in FIG. 10F, each of the forces on a particular node are summed using vector addition, and each node is then moved in accordance with its resulting force vector. The nodes in their new positions are shown in FIG. 10G. Note that, because no forces were applied to node 1010, it was not moved.

Each node may be simply moved a distance that corresponds to the sum of the forces acting on the node. Alternatively, a maximum may be placed on the distance a force is moved by the sum of the forces acting on it. In addition, it may be advantageous to place other limits on movement of the nodes. For example, it may be preferred that a node not be allowed to move out of the routing space. Also, some nodes may be designated is not moveable, in which case they are not moved regardless of any forces applied to them. For example nodes associated with the beginning point or end point of a trace may be designated as not moveable. As another example, nodes specially placed along line segments between adjacent obstacles (e.g., as described above with respect to FIGS. 7–8F) may be designated as not moveable.

The process illustrated in FIG. 9 may be repeated one or more times. Repetition of the process should tend to move the nodes into positions outside of the minimum obstacle-to-trace distance surrounding each obstacle and with at least minimum trace-to-trace clearance between nodes. Note that if nodes are treated as points, the points should be moved away from an obstacle at least by the sum of the minimum obstacle-to-trace distance plus the maximum trace width. Likewise, nodes should be separated from each other at least by the sum of the minimum trace-to-trace clearance plus the maximum trace width.

It should be noted that, prior to applying forces to the nodes, it may be advantageous to examine the separation between nodes in the routing space, and (1) where the separation is less than a threshold, remove a node, and (2) where the separation is greater than another threshold, add a new node. For example, where two adjacent nodes are closer than the nominal trace-to-trace spacing or a fraction (e.g., 0.5 to 1.0) of the trace-to-trace spacing, one of the nodes may be removed. (Nominal trace-to-trace spacing refers to the sum of the minimum trace-to-trace clearance plus the maximum trace width, as received in step 12 of FIG. 1.) As another example, where two adjacent nodes are farther apart than a multiple (e.g., 1.3 to 2.0) of the nominal trace-to-trace spacing the node may be replaced with two nodes. The new nodes may be centered around the location of the replaced node. Preferably, the new nodes are spaced from each other by the nominal trace-to-trace spacing. The foregoing numerical values, however, are exemplary only, and other values may be used with the invention. Moreover, the above-described process of adjusting the number of nodes based on the spacing between adjacent nodes is optional.

Once the process of FIG. 9 has been completed (and repeated as desired), step 44 in FIG. 4 has been completed. Thus, at this point, an initial graph of nodes has been created (step 42 of FIG. 4), and the nodes in the initial graph have been adjusted (step 44 of FIG. 4). It is then time to link the nodes of the graph (step 46 of FIG. 4). This entails creating links (which can be visualized as line segments) linking one node with another. As will be seen, each link represents a possible portion of a route for a trace.

Figure 11:
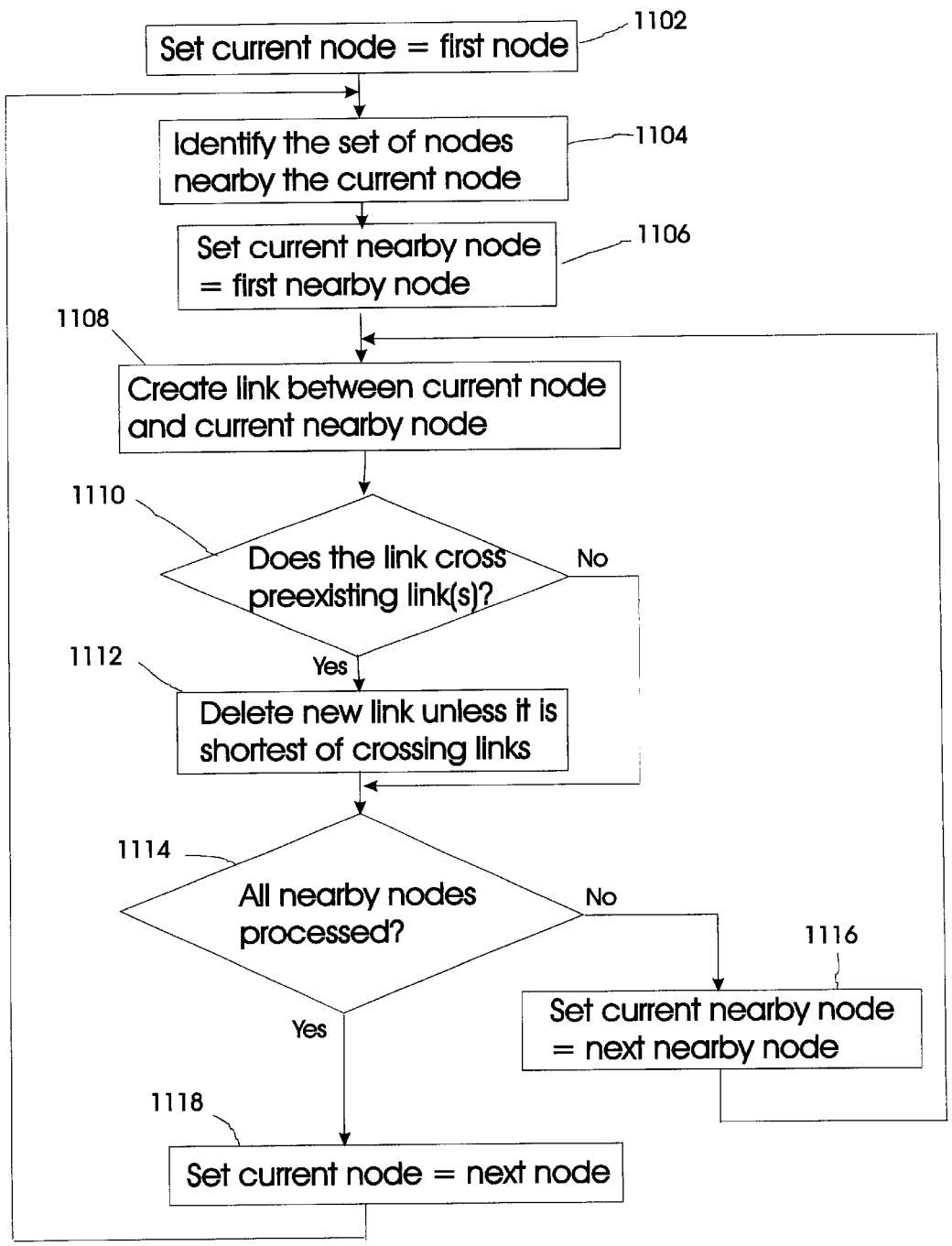
FIG. 11 illustrates an exemplary process for performing step 46 of FIG. 4.

In linking the nodes of the graph, it is desirable to create as many links as is reasonably possible without creating links that cross other links. FIG. 11 illustrates an exemplary process for linking nodes (which may be used to implement step 46 of FIG. 4), and FIGS. 12A–12I illustrate an exemplary application of the process illustrated in FIG. 11.

Figure 12A:
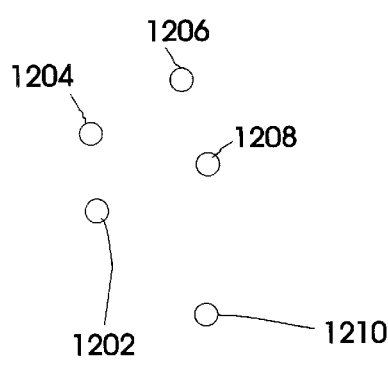
FIGS. 12A–12J illustrate application of the process of FIG. 11 to an exemplary graph of nodes.

As shown in FIG. 11, one of the nodes in the routing space is initially designated as the "current node." FIG. 12A shows a simplified node pattern in a routing space (not designated in FIG. 12A). As can be seen, the exemplary node pattern consists of five nodes 1202, 1204, 1206, 1208, 1210. In the example shown in FIG. 12A, node 1202 is initially designated as the current node at step 1102 of FIG. 11. Selection of an initial node as the current node, however, may be arbitrary, and any of the other nodes 1204, 1206, 1208, 1210 could alternatively have been selected as the first node to be designated as the current node.

Figure 12B:
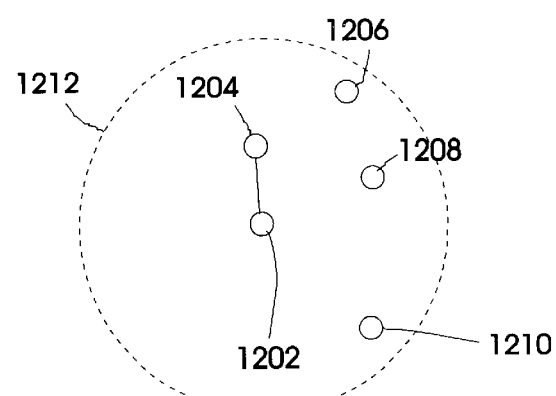

Referring again to FIG. 11, the exemplary process then identifies a set of nodes that are nearby the "current node." FIG. 12B illustrates on exemplary way of identifying a set of nearby nodes. As shown in FIG. 12B, all other nodes in the routing space that are within a threshold distance of the "current node" (here node 1202) are identified as "nearby nodes." Circle 1212 in FIG. 12B defines the threshold distance, and in the example shown in FIG. 12B, all of the other four nodes 1204, 1206, 1208, and 1210 are within the threshold distance from the "current node" 1202.

It should be noted that there are alternative ways of identifying a set of nodes that are nearby the current node. One such way is to divide the routing space into contiguous areas, such as squares or rectangles. Nearby nodes can then be defined as all nodes falling within the same area as the "current node," or all nodes falling within the same area as the current node as well as areas that are contiguous with the current node's area, etc. Another such way involves the use of Cartesian coordinates defining the locations of two adjacent nodes to calculate the distance between the nodes. Schemes may also be employed to reduce or eliminate the number of nodes that are processed twice. For example, only nodes that are within the threshold distance of the "current node" and whose Cartesian coordinates meet one of the following two criteria are considered "nearby nodes": (1) the node's "y" coordinate is greater than the "y" coordinate of the "current node," or (2) the node's "y" coordinate and the "current node's" "y" coordinate are equal and the current node's "x" coordinate is greater than the "x" coordinate of the "current node." The foregoing example should result in the processing of each pair of adjacent nodes only one time. These as well as other ways of identifying a set of nodes that are nearby the current node may be used with the current invention.

Referring again to FIG. 11, at step 1106, the process selects one of the nearby nodes for processing and designates the selected nearby node as the "current nearby node." Selection of one of the nearby nodes may be arbitrary. For the purpose of this discussion, it will be assumed node 1204 in FIG. 12B is initially designated as the "current nearby node" at step 1106. At step 1108, a link is created between the "current node" (node 1202) and the "current nearby node" (node 1204), which link is depicted in FIG. 12B as a line segment between nodes 1202 and 1204. At step 1110, the process determines whether the link crosses a preexisting link. As shown in FIG. 12B, the link between node 1202 and node 1204 does not cross a preexisting link. Thus, the process illustrated in FIG. 11 proceeds to step 1114, where it determines whether all of the "nearby nodes" identified at step 1104 have been processed.

Figure 12C:
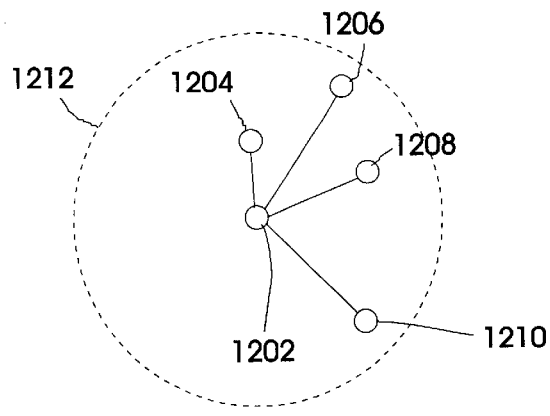

In the example illustrated in FIG. 12B, nodes 1206, 1208 and 1210, all identified as "nearby" nodes to "current node" 1202 at step 1104, have yet to be processed. Accordingly, the process of FIG. 11 sets the "current nearby node" equal to one of the as yet unprocessed "nearby nodes" at step 1116, which selection may be arbitrary. For the purpose of this discussion, it will be assumed that node 1206 in FIG. 12B is designated as the "current nearby node" at step 1116, although any of the other nodes 1208 and 1210 could have alternatively been designated as the "current nearby node." The process then returns to step 1108, where a link is created between "current node" 1202 and "current nearby node" 1206. This process continues until all of the "nearby nodes" 1204, 1206, 1208, 1210 to "current node" 1202 have been processed, and as shown in FIG. 12C, links have been created between the "current node" 1202 and each of the "nearby nodes" 1204, 1206, 1208, 1210.

After the last of the "nearby nodes" 1204, 1206, 1208, 1210 has been processed and a link created between it and the "current node" 1202, the process branches at step 1114 to step 1118 because all nodes in the nearby set identified at step 1104 have been processed. This being the case, another node in the routing space is designated as the "current node" at step 1118. It does not matter how the next node is selected. For purposes of this discussion, it is assumed that node 1204 is designated as the "current node" at step 1118. The process of FIG. 11 then identifies a set of nearby nodes to the "current node" (node 1204) at step 1104.

Figure 12D:
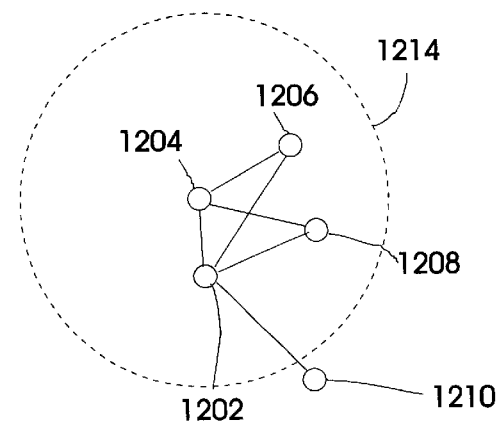

In the example illustrated in FIG. 12D, circle 1214, with current node 1204 at its center, defines the set of nodes that are nearby current node 1204. In this case, the nearby nodes are nodes 1202, 1206, and 1208. Because node 1210 falls outside of circle 1214, it is not included in the set of nearby nodes to current node 1204. Thereafter, the process of FIG. 11 is repeated, with node 1204 being set as the current node, and nodes 1202, 1206, 1208 being nearby nodes. As shown in FIG. 12C, this results in the creation of two new links: a link between node 1204 and 1206, and a link between node 1204 and 1208.

Figure 12E:
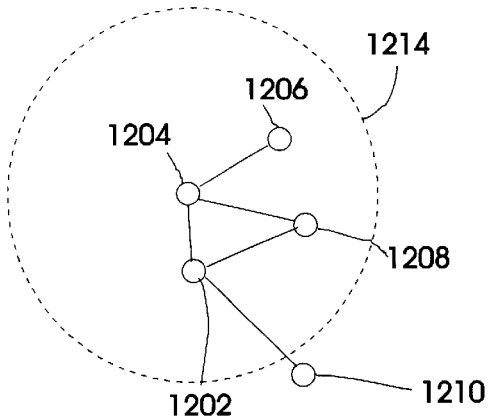

As can be seen in FIG. 12D, the new link between nodes 1204 and 1208 crosses a preexisting link between nodes 1202 and 1206. Thus, following creation of the link between nodes 1204 and 1208 at step 1108 of FIG. 11, the process executes step 1112 and deletes the longer of the two crossing links. In this case, the longer of the two crossing links is the preexisting link between nodes 1204 and 1208, and as shown in FIG. 12E, this link is deleted at step 1112 of FIG. 11. Although not shown in the simplified example of FIG. 12D, it is possible that a new link crosses more than one previously created link. In such a case, all of the previously created links crossed by the new link are identified at step 1110, and the new link is deleted at step 1112 unless it is shorter than all the previously created links it crosses, in which case all the previously created links it crosses are deleted at step 1112.

For purposes of FIG. 11, two links (for purposes of determining intersections, a link is treated as a line segment between the centers of two nodes) cross if either of the following is true: (1) the two links cross at a point located between the end points of either link (the end points of a link being the two nodes (or the center points of the nodes) between which the link is formed; or (2) any non-zero distance of one link exactly coincides with a non-zero distance of the other link. Conversely, two links do not intersect if either of the following is true: (1) the links share no common point; or (2) the links share a single common end point, but do not coincide for any non-zero distance.

Figure 12F:
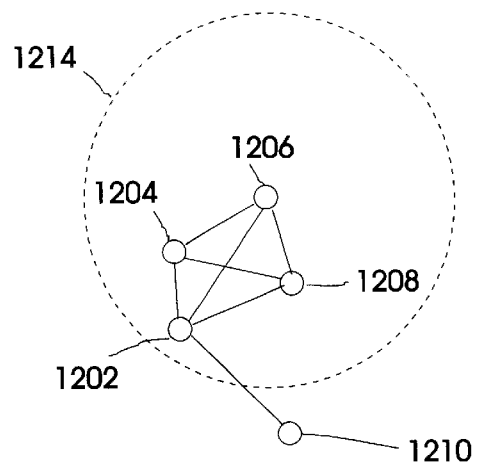
Figure 12G:
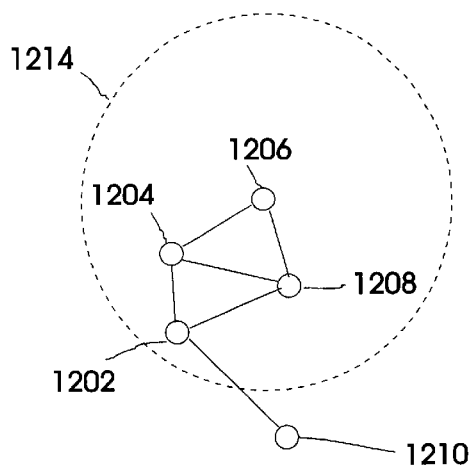
Figure 12H:
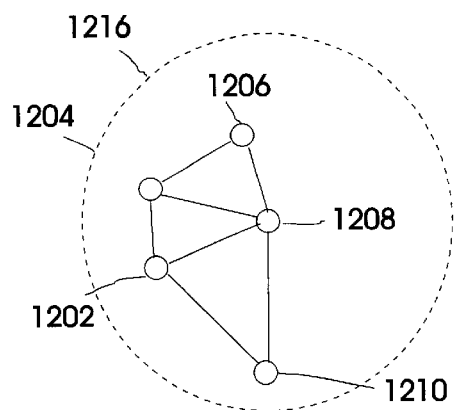
Figure 12I:
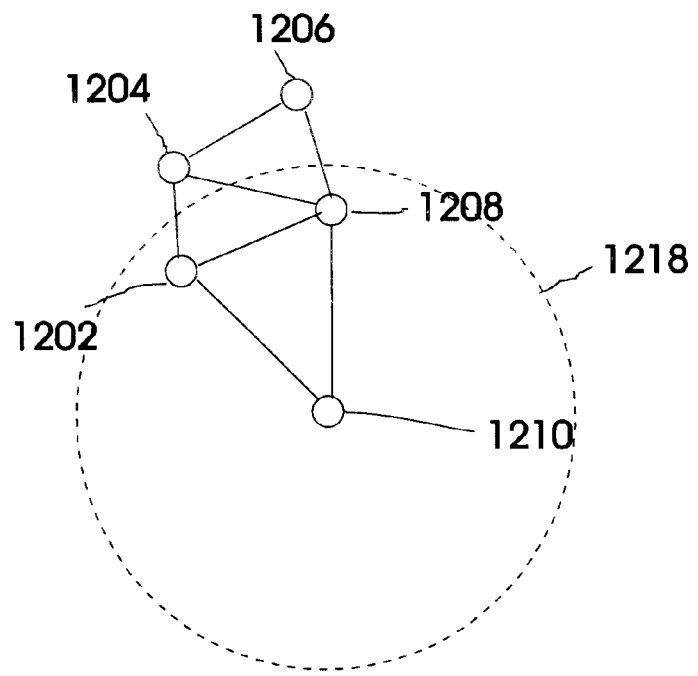
Figure 12J:
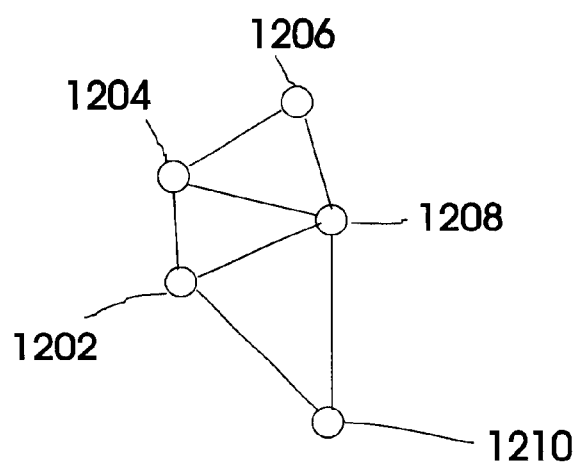

As shown in FIGS. 12F–12I, the process of FIG. 11 is continued until all of the nodes in the routing space have been processed as the "current node." FIGS. 12F and 12G illustrate processing while node 1206 is designated the "current node," FIG. 12H illustrates processing while node 1208 is designated the "current node," and FIG. 12I illustrates processing while node 1210 is designated the current node.

To simplify the discussion of FIG. 11, no steps are shown for terminating the process following processing of the last of the nodes in the routing space as the "current node." Persons of ordinary skill in the field, however, will readily recognize the need for such steps and can easily devise such steps. Therefore, such steps are not included in FIG. 11 or discussed herein. After all five of the nodes 1202, 1204, 1206, 1208, 1210 shown in FIG. 12A have been processed as the "current node," seven links will have been created between the nodes, as shown in FIG. 12H. As will be discussed in more detail below, each link represents a potential routing path between nodes for a trace.

It should be apparent that the process of FIG. 11 is illustrative only, and other processes may be devised for creating links between nodes. For example, the process of FIG. 11 may be modified to delete any newly created link that passes within a given threshold distance of any other node. Alternatively, once all of the nodes in a graph have been linked using the process of FIG. 11, other processes may be performed on the graph to create additional links. For example, the boundary around the "current node" that defines the set of "nearby nodes" may be increased and additional links that do not cross existing links created. As mentioned above, such new links may be deleted if they pass within a specified threshold distance of a node other than the node between which the link is created.

Once the graph of nodes has been linked, one or more processes may be performed for cleaning up the links. For example, one or more line segments between obstacles, such as those described above for adding or deleting nodes between obstacles (see, e.g., the discussion of FIG. 7 above), or extensions of the line segments to points within the obstacles, may be calculated and the number of possible paths crossing the line segment determined. The number of paths that cross the line segment is the sum of the nodes that lie on the line segment plus the number of links that cross the line segment. Clean up of the links may include deleting links that cross the line segment and/or nodes lying on the line segment if the number of paths that cross the line is greater than the number of traces that may legally fit between the obstacles in accordance with the applicable design rules.

Once the nodes of the graph have been linked as per step 46 of FIG. 4, the routing graph has been created as per step 32 of FIG. 3. Thereafter, traces are routed at step 34 of FIG. 3. Before describing processes for routing traces through the linked graph, it should be noted that the linked graph is not limited to any particular configuration. For example, the angles formed by the links are not limited to any particular set of angle sizes; rather, the various angles may be any size angle. Indeed, even if the initial graph created at step 42 of FIG. 4 is a regular graph, which would result in angles formed by the links that are limited to a particular set of angle sizes, the process of adjusting the nodes of the graph (step 44 of FIG. 4) typically causes the graph to be irregular at least in the sense that the angles formed by the links are not limited to a particular set of angle sizes. Of course, if the initial graph created at step 42 is irregular or quasi-irregular, the angles formed by the links are even more likely to be irregular throughout the graph.

Figure 13:
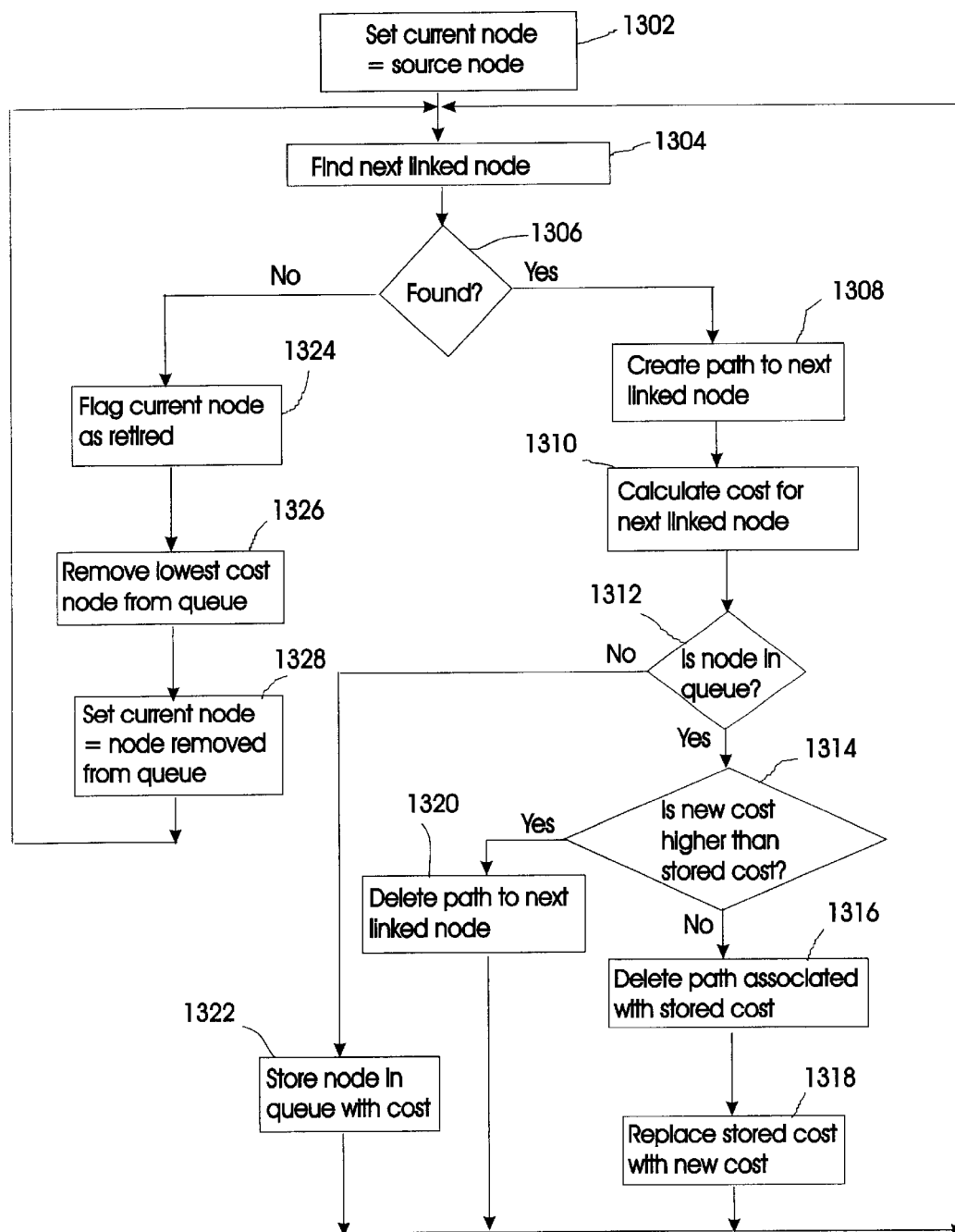
FIG. 13 illustrates an exemplary process for performing step 34 of FIG. 3.

FIG. 13 illustrates an exemplary process for routing a trace through a routing graph. Generally speaking, the process illustrated in FIG. 13 starts with the source node, that is, the node in the graph from which the trace to be routed originates. The location of the source node is typically defined in a net list received at step 12 of FIG. 1. The net list defines the traces to be routed by identifying pairs of components (or alternatively, sets of three or more components) that are to be electrically connected via a trace. The process then creates paths between the source node and each node to which the source node is linked. For each such node, the process estimates the length of a trace through that node between the source and destination nodes. This estimate is referred to as the routing cost in the description of FIG. 13. Thereafter, the process selects the node with the lowest routing cost, and creates paths between that node and each node to which the selected node is linked and estimates a routing cost for each such node. This process continues until an unbroken path has been created between the source node and the destination. If the routing cost is estimated appropriately, the unbroken path is either the shortest path or one of the shortest possible paths through the linked graph between the source node and the destination node.

Figure 14A:
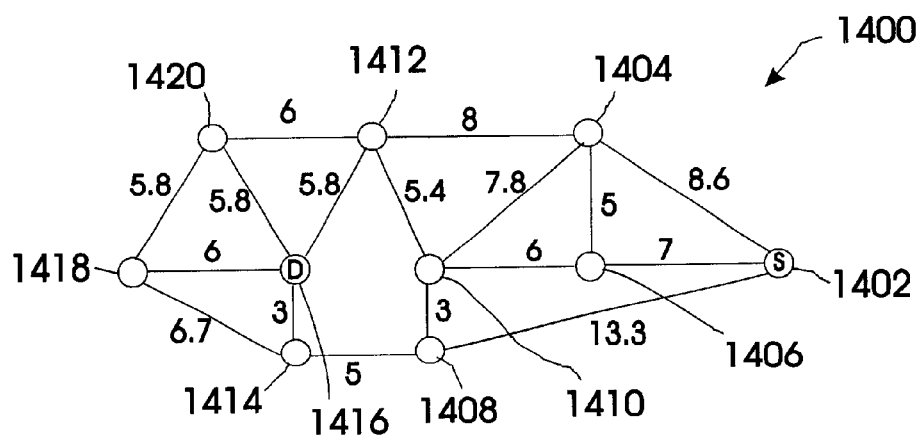
FIGS. 14A–14M illustrate application of the process of FIG. 13 to an exemplary linked graph of nodes.

FIGS. 14A–14M show an example of the operation of the process illustrated in FIG. 13. FIG. 14A illustrates a simplified, exemplary linked graph 1400. Distances between nodes are shown in generic length "units." Of course, the specific pattern of the nodes and the distances between the nodes are exemplary only. The beginning node, here node 1402, may be referred to as the "source" node; the end node, here node 1416, may be referred to as the "destination" node. In the exemplary linked graph shown in FIG. 14A, the source node 1402 is marked with an "S," and the destination node 1416 is marked with a "D." It should be noted that the linked graph 1400 is preferably created using the procedures and processes described above for creating a linked graph. The exemplary routing process described in FIG. 13, however, may be used with any linked graph regardless of how it was created. Thus, use of the process of FIG. 13 is not limited to linked graphs created using any of the processes, procedures, or principles described in this application.

Figure 14B:
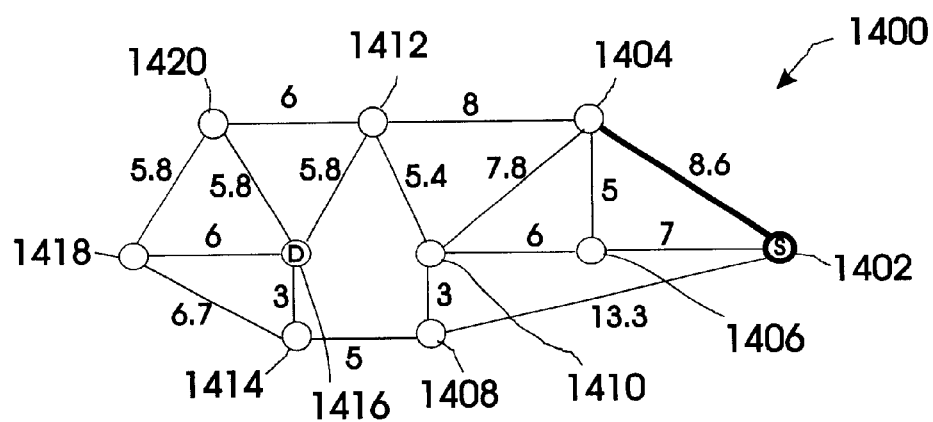

As shown in FIG. 13, the process begins by designating the source node as the "current node." At step 1304, the process finds a node to which the current node is linked. In the example illustrated in FIG. 14A, the current node 1402 is linked to three other nodes: node 1404, node 1406, and node 1408. At step 1304 of FIG. 13, the process may select any of the as yet unprocessed nodes to which the current node is linked. For the sake of discussion, it is assumed that the process selects node 1404 at step 1304. Because an unprocessed linked node (i.e., a "next linked node") was found at step 1304, the process branches at step 1306 to step 1308. At step 1308, a path is created between the current node (here node 1402) and the selected linked node (here node 1404). This is illustrated in FIG. 14B, which shows node 1402 highlighted because it is the current node, and shows a highlighted link between nodes 1402 and 1404, indicating that a path has been created between these nodes.

Referring again to FIG. 13, a routing cost is calculated for node 1404 at step 1310. One exemplary way to calculate a routing cost for such a particular node is as follows:

routing cost for $node_x$=[distance from $node_x$ to the source node utilizing created paths and passing through the current node]+[straight-line distance from $node_x$ to the destination node].

As should be apparent, the routing cost for $node_x$ represents an estimated length of a trace through $node_x$. The first half of the above formula—the distance from $node_x$ to the source node through created paths and the current node—is the length of a trace through the linked graph from the source node to $node_x$. The second half of the formula—the straight-line distance from $node_x$ to the destination node—may be thought of as an estimate of the distance from $node_x$ through the linked graph to the destination node. The sum represents an estimate of the length of a trace that passes through $node_x$ through the linked graph. Thus, the lower the routing cost for a node, the less the estimated length of a trace through the node. Use of nodes with lower routing costs are most likely to yield a trace with the shortest or approximately shortest length through the linked graph.

It should be noted, however, that the invention is not limited to use of the above formula, which attempts solely to minimize the length of a trace. Rather, other formulas for estimating the length of a trace through a node may be used. Moreover, the formula need not be related solely to the estimated length of a trace through the node, but may more generally be related to an estimated suitability of a trace through the node. For example, the formula may be designed to route a trace through a predetermined area of the routing space, to minimize the length of a trace in a particular area of the routing space, direct the trace into a preferred routing direction or directions, avoid the crossing of traces, or direct any crossing of traces to occur at preferred areas of the routing space, to name just a few. Of course, the formula may be designed to do any combination of such things.

As shown in FIG. 14B, the distance from node 1404 to the source node 1402 through the just-created path is 8.6 units. The straight-line distance from node 1404 to the destination node 1416 is approximately 12.1 units. Although this is not shown on FIG. 14B, it can be derived from the dimensions shown on FIG. 14B. As can be seen in FIG. 14B, the straight-line distance between node 1404 and destination node 1416 is equal to the length of a hypotenuse of a right triangle whose legs are formed by the distance from node 1416 to node 1406 (11 units) and the distance between node 1406 and node 1404 (5 units). Thus, according to the above described cost formula, the routing cost associated with node 1404 is 20.7 units (8.6 units+12.1 units). Data identifying node 1404 along with the routing cost for node 1404 are stored in a priority queue at step 1322. (Because this is the first pass through the process illustrated in FIG. 13, the priority queue would have been empty at step 1312, causing the process to branch to step 1322.)

At this point, a path has been created from source node 1402 to node 1404, a routing cost has been calculated for node 1404, and the routing cost has been stored in a priority queue. The contents of the priority queue are as follows:

| Node | Routing Cost |
|------|--------------|
| 1404 | 20.7 |

Figure 14C:
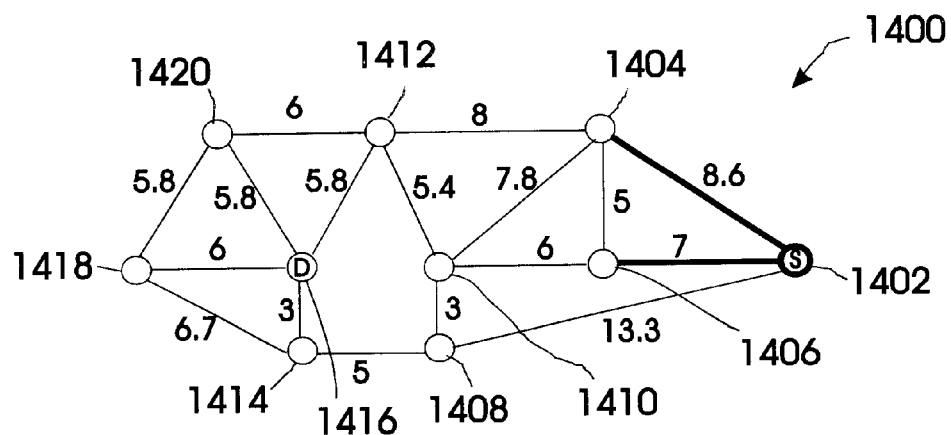

The process of FIG. 13 then branches back to step 1304, where it looks for another node linked to the current node (still node 1402). As shown in FIG. 14B, nodes 1406 and 1408 are linked to the current node 1402, and the process selects node 1406 at step 1304 and proceeds to step 1308. At step 1308, the process creates a path from the current node 1402 to node 1406, as shown in FIG. 14C. At step 1310, the process calculates a routing cost for node 1406. As shown in FIG. 14C, the distance from the source node 1402 to node 1406 is 7 units, and the straight-line distance from node 1406 to the destination node 1416 is 11 units. Thus, the routing cost according to the above described formula is 18 units (7 units+11 units). At step 1312, the process determines whether the priority queue already contains a routing cost for node 1406. At this point, the priority queue includes only one entry, and that is for node 1404. The priority queue contains no entries for node 1406, so the process branches to step 1322, where an entry is made in the priority queue for node 1406 with a routing cost of 18 units.

At this point, as shown in FIG. 14C, node 1402 is still the current node, and two paths have been created in the linked graph 1400: one path between node 1402 and node 1404, and another path between node 1402 and node 1406. The contents of the priority queue are as follows:

| Node | Routing Cost |
|------|--------------|
| 1404 | 20.7 units   |
| 1406 | 18 units     |

Figure 14D:
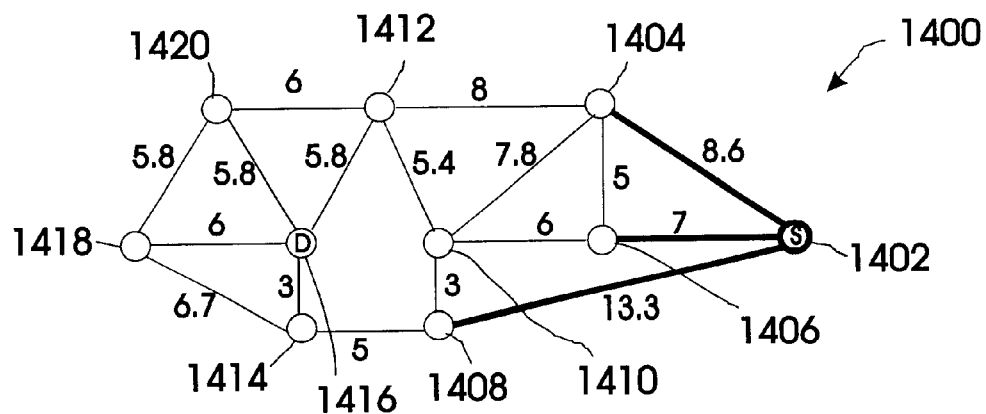

The process again loops back to step 1304. Now only one unprocessed node linked to the current node 1402) remains unprocessed: node 1408. That node is found at step 1304, and at step 1308, a path is created from the current node 1402 to node 1408 as shown in FIG. 14D. At step 1310, a routing cost is calculated for node 1408. As can be seen from FIG. 14D, the distance from the source node 1402 to node 1408 through created paths is 13.3 units. The straight-line distance between node 1408 and the destination node 1416 is 5.8 units (this being the hypotenuse of a right triangle formed by nodes 1408, 1414, and 1416). Thus, using the above described exemplary routing cost formula, the routing cost is 19.1 units.

At this point, as shown in FIG. 14D, three paths have been created between the current node 1402 and each of the three nodes 1404, 1406, 1408 to which the current node 1402 is linked. The contents of the priority queue are as follows:

| Node | Routing Cost |
|------|--------------|
| 1404 | 20.7 units   |
| 1406 | 18 units     |
| 1408 | 19.1 units   |

The process again loops back to step 1304. This time, however, no unprocessed nodes linked to the current node 1402 are found, as nodes 1404, 1406, and 1408 have all been processed. Therefore, the process branches at step 1306 to step 1324, where the current node (here 1402) is flagged as "retired" because it has been completely processed. That is, all least-cost paths through the node have been explored. Then, at step 1326, the node with the lowest routing cost is removed from the priority queue. As mentioned above, the priority queue contains three entries—one each for nodes 1404, 1406, 1408—and the node with the lowest routing cost is node 1406. Thus, the entry for node 1406 is removed from the priority queue at step 1326, and at step 1328, node 1406 is designated as the new "current node." (Because node 1402 has been completed or retired, it is shown in FIGS. 14E–14L in dashed line.) At this point, node 1406 is the "current node," and the contents of the priority queue are as follows:

| Node | Routing Cost |
|------|--------------|
| 1404 | 20.7 units   |
| 1408 | 19.1 units   |

Figure 14E:
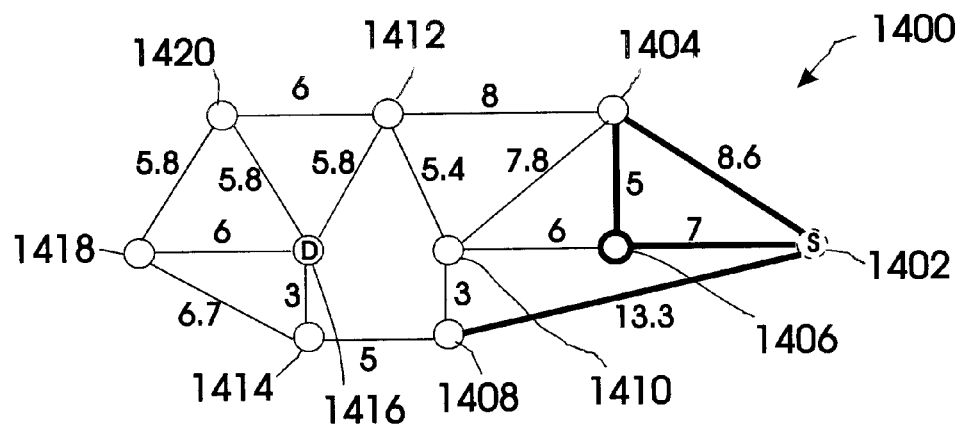

The process of FIG. 13 again loops back to step 1304, where it looks for a node that is linked to the current node, now node 1406. As can be seen in FIG. 14A, three nodes are linked to node 1406: node 1402, node 1404, and node 1410. Because node 1402 has been fully processed and is flagged as retired, it is ignored at step 1304. Neither node 1404 nor node 1410, however, has been retired, and consequently, one is selected at step 1304. For purposes of this discussion, it will be assumed that node 1404 is selected at step 1304. At step 1308, a path is created from the current node 1406 to node 1404, as shown in FIG. 14E. (Node 1406 is highlighted in FIG. 14E, indicating that it is the "current node.") At step 1310, a routing cost is calculated for node 1404. As can be seen from FIG. 14E, the distance from node 1404 to the source node 1402 utilizing existing paths and passing through the current node 1406 is 12 units (the sum of the distances from node 1404 to node 1406 and from node 1406 to node 1402). The straight-line distance from node 1404 to the destination node 1416 is 12.1 units (calculated as the length of the hypotenuse of a right triangle formed by nodes 1416, 1406, 1404). Thus, the total routing cost for node 1404 according to the above described exemplary formula is 24.1 units.

The priority queue, however, already contains an entry for node 1404. Consequently, the process branches at step 1312 to step 1314, to determine which is higher, the newly calculated cost for node 1404 (here 24.1 units) or the stored cost for node 1404 (here 20.7 units). Because the newly calculated cost is greater, the process branches to step 1320, and the newly created path from the current node 1406 to node 1404 is deleted. Note that no new entry is made in the priority queue.

Figure 14F:
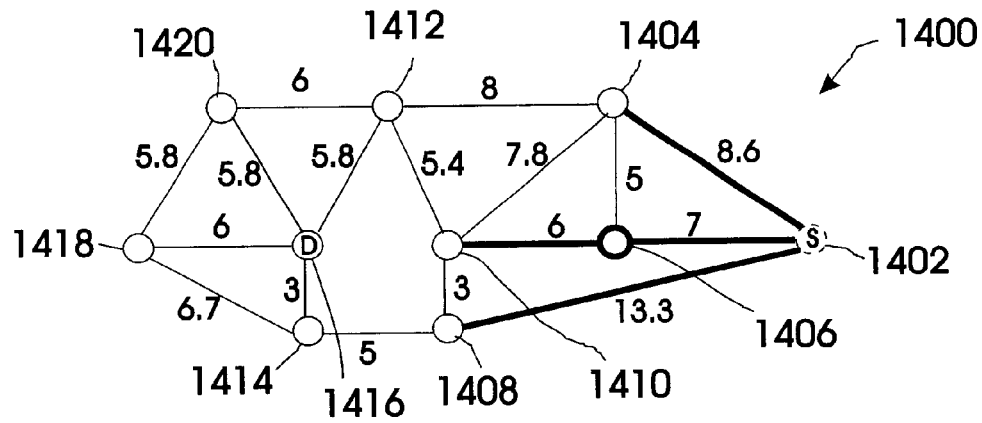

The process again loops back to step 1304. Now, only one node linked to the current node 1406 remains unprocessed, and that is node 1410. It is found at step 1304, and a path is created between the current node 1406 and node 1410 at step 1310. (This is shown in FIG. 14F, which also shows no path between node 1406 and node 1404 because that path was deleted at step 1320 as described above). A cost for node 1410 is calculated at step 1310. As shown in FIG. 14F, the distance between node 1410 to the source node 1402 utilizing created paths and passing through the current node 1406 is 13 units (the sum of the distances between nodes 1410 and 1406 and nodes 1406 and 1402). The straight-line distance between node 1408 and destination node 1416 is 5 units, as also shown in FIG. 14F. Thus, according to the exemplary routing cost formula described above, the routing cost for node 1410 is 18 units.

Because there is no entry in the priority queue for node 1410, the process branches to step 1322, and creates an entry for node 1410 with a routing cost of 18 units. As shown in FIG. 14F, at this point, four paths have been created between nodes in the graph 1400 (paths between nodes 1402 and 1404, nodes 1402 and 1406, nodes 1406 and 1410, and 1402 and 1408). The contents of the priority queue are as follows:

| Node | Routing Cost |
|------|--------------|
| 1404 | 20.7 units   |
| 1408 | 19.1 units   |
| 1410 | 18 units     |

The process again loops back to step 1304. Because all of the nodes that are linked to the current node 1406 have now been processed, no next linked node is found at step 1304. Consequently, the process branches at step 1306 to step 1324. At step 1324, current node (here node 1406) is flagged as completed or retired. At step 1326, the node with the lowest routing cost is removed from the priority queue and designated as the new "current node." at steps 1326 and 1328, respectively. (In FIGS. 14G–14L, node 1406 is shown in dashed line to indicate that it has been retired.) As shown above, three nodes are in the priority queue—nodes 1404, 1408, and 1410—and node 1410 has the lowest cost. Therefore, node 1410 is deleted from the priority queue and designated the "current node."

Figure 14G:
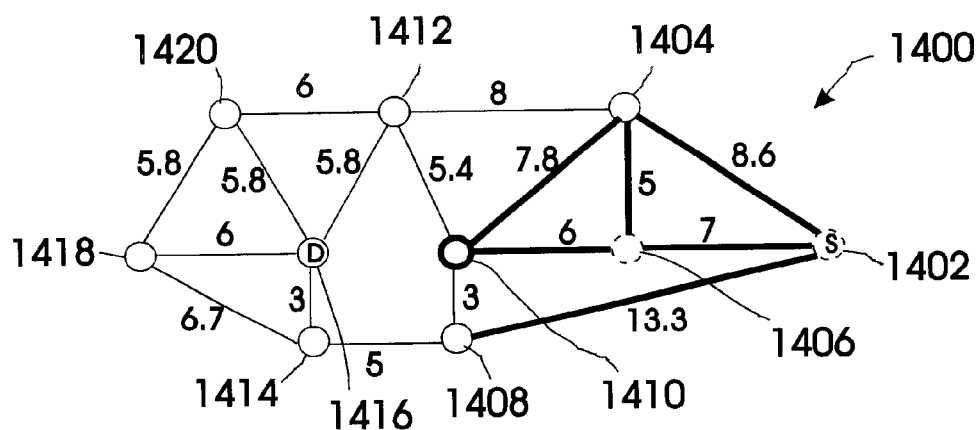

The process loops back to step 1304, where it looks for nodes to which the current node 1410 is linked. As shown in FIG. 14A, the current node 1410 is linked to four nodes: node 1404, node 1406, node 1408, and node 1412. Node 1406, however, has been retired, so it is ignored. At step 1304, the process may find any of the other three nodes. For purposes of this discussion, it is assumed that the process finds node 1404 at step 1304. At step 1308, the process creates a path from the current node 1410 to node 1404, and at step 1310, the process calculates a routing cost for node 1404. As can be seen in FIG. 14G, the distance between node 1404 utilizing existing paths and passing through the current node 1410 to the source node 1402 is 20.8 units (the sum of the distances between nodes 1404 and 1410, nodes 1410 and 1406, and nodes 1406 and 1402.) The straight-line distance between node 1404 and the destination node 1416 is 12.1 units (the length of the hypotenuse of a right triangle formed by nodes 1404, 1406, and 1416). Thus, the total routing cost for node 1404 is 32.9 units.

Because there is already an entry in the priority queue for node 1404, the process branches at step 1312 to step 1314, where it is determined whether the new cost for node 1404 is higher than the cost for node 1404 stored in the priority queue at step 1314. In this case, the new cost is higher than the stored cost. Consequently, the process branches to step 1320, where the newly created path between node 1410 and node 1404 is deleted. (Again, note that no new entry was made on the priority queue.)

Figure 14H:
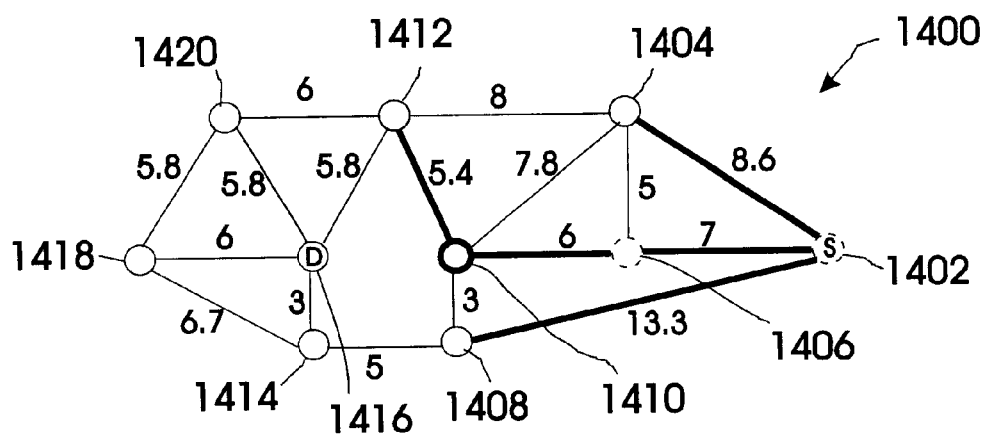
Figure 14I:
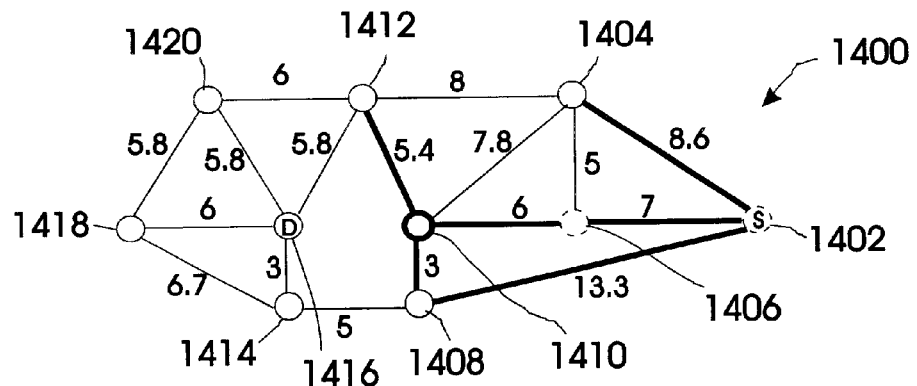

As illustrated in FIGS. 14H and 14I, the process of FIG. 13 is repeated with node 1410 as the current node and node 1412 as the "found" linked node at step 1304 and then node 1408 as the "found" linked node again at step 1304. The results are illustrated in FIGS. 14H and 14I. As shown in FIG. 14H, a path is formed between node 1410 and node 1412, and an entry is made in the priority queue for node 1412. Although a path is temporarily created between node 1410 and node 1408 as shown in FIG. 14I, that path is removed because the calculated routing cost for node 1408 after temporary creation of the path between node 1410 and node 1408 resulted in a routing cost that was greater than the routing cost calculated as a result of creation of the path between node 1402 and 1408. (See the discussion above regarding similar paths created between nodes 1406 and 1404 and nodes 1410 and 1404.)

At this point (corresponding to FIG. 14I after removal of the path between nodes 1408 and 1410 as discussed above), five paths have been created between nodes in the graph 1400 (i.e., paths between the following pairs of nodes— 1402/1404, 1402/1406, 1402/1408, 1406/1410, and 1410/1412—and the contents of the priority queue are as follows:

| Node | Routing Cost |
|------|-------------|
| 1404 | 20.7 units  |
| 1408 | 19.1 units  |
| 1412 | 24.2 units  |

Because all of the nodes linked to current node 1410 have now been processed, node 1410 is flagged as retired at step 1324, and the node with the lowest cost is removed from the priority queue and designated as the new "current node."

Figure 14J:
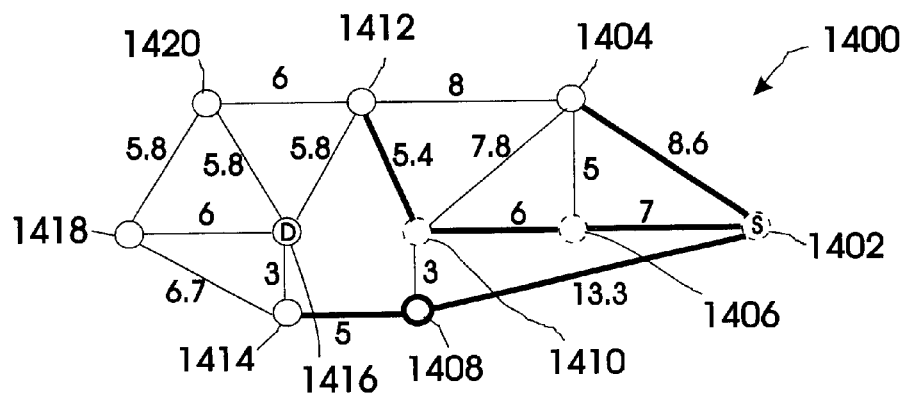

As can be seen from the above table, node 1408 is the node in the priority queue with the lowest cost. Node 1408 is therefore deleted from the priority queue at step 1326 and designated the "current node" at step 1328. As shown in FIG. 14A, node 1408 is linked to three other nodes: nodes 1402, 1410, and 1414. Because nodes 1402 and 1410 were previously retired, they are ignored. Further execution of the process of FIG. 13 results in the creation of a path between node 1408 and 1414 as shown in FIG. 14J, at which time node 1408 is retired. At this point the contents of the priority queue are as follows:

| Node | Routing Cost |
|------|-------------|
| 1404 | 20.7 units  |
| 1412 | 24.2 units  |
| 1414 | 21.3 units  |

Figure 14K:
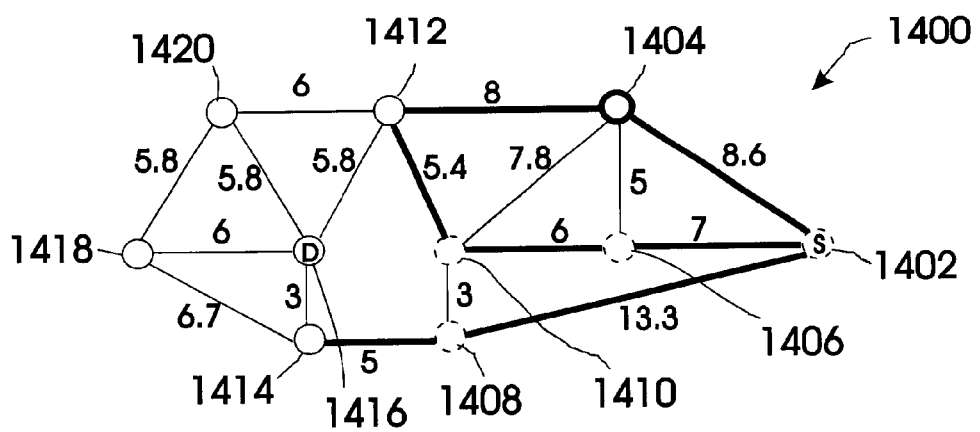

As can be seen from the above table, node 1404 is now the node in the priority queue with the lowest priority. Node 1404 is therefore deleted from the priority queue and designed the "current node" at step 1328 of FIG. 13. As shown in FIG. 14K, node 1404 is linked to only one node that has not been retired: node 1412. Consequently, the process of FIG. 13 creates a path from node 1404 to node 1412, and calculates a cost for node 1412 at steps 1308 and 1310. Using the above described exemplary formula, the cost for node 1412 is calculated to be 22.4. As can be seen from the above table, an entry in the priority queue already exists for node 1412, but the newly calculated cost for node 1412 is less than the cost stored in the priority queue. Consequently, the process of FIG. 13 branches at step 1314 to step 1316, and there deletes the path associated with the previously stored cost for node 1412, which is the path from node 1410 to node 1412. The process then replaces the previously calculated cost for node 1412 stored in the priority queue with the newly calculated cost of 22.4 units.

At this point, the contents of the priority queue are as follows:

| Node | Routing Cost |
|------|-------------|
| 1412 | 22.4 units  |
| 1414 | 21.3 units  |

Because all of the nodes linked to current node 1404 have now been processed, node 1404 is flagged as retired at step 1324, and the node with the lowest cost is removed from the priority queue and designated the new "current node."

As can be seen from the above table, node 1414 is now the node in the priority queue with the lowest cost. Node 1414 is therefore deleted from the priority queue at step 1326 and designated the "current node" at step 1328. A shown in FIG. 14A, node 1414 is linked to three other nodes: nodes 1408, 1416, and 1418, although node 1408 is retired. Because one of the nodes to which node 1414 is linked is the destination node 1416, further execution of FIG. 13 will result in creation of a path from node 1414 to the destination node 1416 as shown in FIG. 14L.

Once a path is made to the destination node 1416, a set of paths linking the source node 1402 and the destination node 1416 has been created. As mentioned above, to simplify the presentation and discussion of FIG. 13, no steps are shown for terminating the process upon creation of a path to the destination node. Persons of ordinary skill in the field, however, would readily recognize the need for such steps and be able to formulate such steps. For example, a decision step could be included between steps 1308 and 1310 to determine whether the created path terminated on the destination node, and if so, the process could branch to steps for ending the routine. Alternatively, the process of FIG. 13 could treat the destination node as any other node, computing a cost for the destination node, and placing it in the priority queue after a path is created to the destination node at steps 1308, 1310, 1312, 1322, and the process of FIG. 13 could be continued until the destination node is removed from the queue at step 1326. Alternatively, a step could be included between steps 1324 and 1326 to determine whether the destination node is in the priority queue (regardless of whether it has the lowest cost of the nodes in the queue), and if it is, the process of FIG. 13 could be terminated. The process of FIG. 13 could also be terminated if the priority queue becomes empty, indicating that no route is possible. In addition, limits could be set that, if reached, cause the process of FIG. 13 to terminate. Examples of such limits include without limitation a time limit, a limit on the size of the priority queue, and a limit on the number of nodes retired.

Figure 14L:
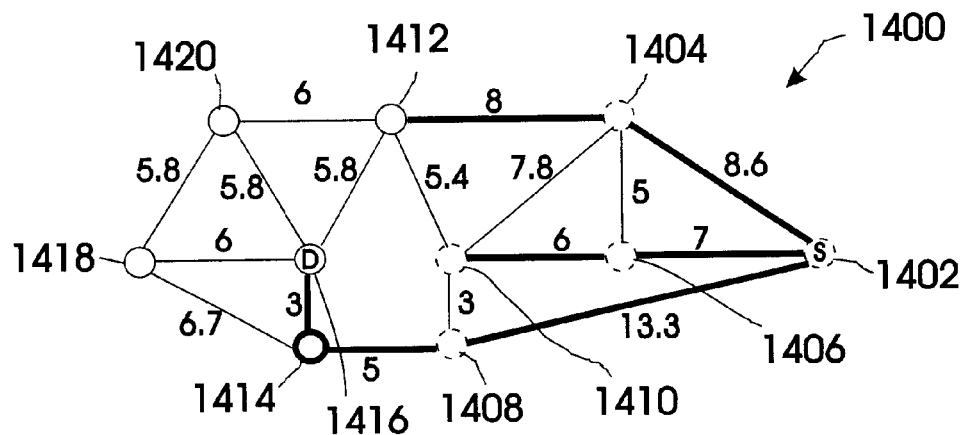
Figure 14M:
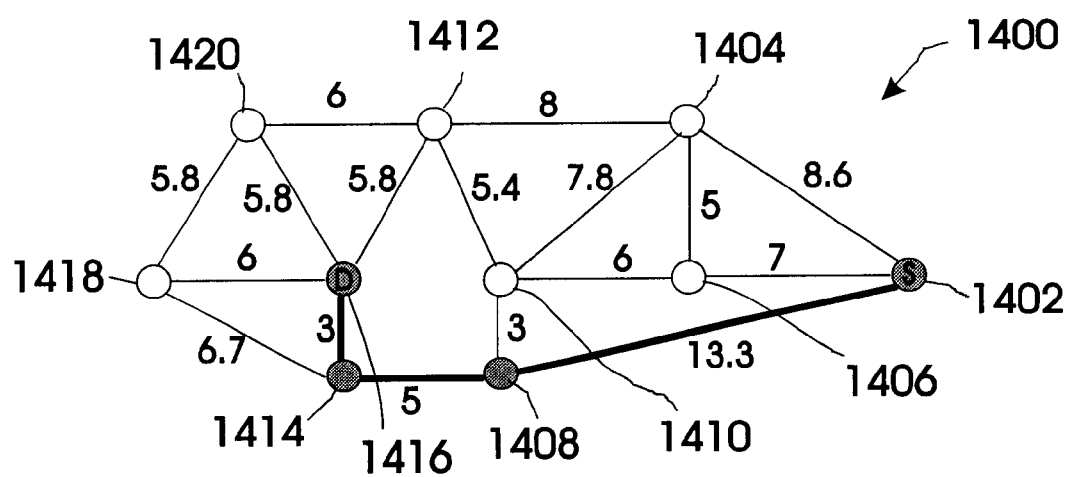

As shown in FIG. 14L, a trace path has been found from source node 1402 to node 1408 to node 1414 to node 1416, and this is the shortest path through the various links of the graph 1400 between source node 1402 and destination node 1416. It should be apparent that the trace path found using the above described process might not always be, in some instances, the shortest path, but nevertheless is likely to be a reasonably short path through the graph if not the shortest path. (Of course, if, as discussed above, a formula designed to route traces with attributes other than the shortest possible length is used to compute the routing cost, the trace path may not be the shortest path through the graph.) Once the a complete path has been found, paths created between nodes that do not form a portion of the final path between source node and destination may be deleted, as shown in FIG. 14M.

As mentioned above, the invention is not limited to the specific routing cost formula specified above. Any formula for estimating the length of a trace through a node may be used to calculate the routing cost for that node. In addition, other "costs" may be included in the above specified routing cost formula or any similar formula. For example, costs may be included in the calculation for a particular node where (1) the node lies on a previously created trace through the linked graph, and/or (2) the just-created path to the node crosses to the other side of a previously created trace. By appropriately sizing the above costs associated with impinging or crossing a previously created trace, the routing process can be biased against finding a route that crosses another trace.

Of course, there may be instances in which, for one reason or another, a trace is routed such that it touches or crosses over a previously routed trace. If this happens, one or both of the impinging or crossing traces may be deleted (sometimes referred to in the field as "ripping up" the trace), in which case another attempt will be made to route the ripped up trace or traces.

If no route is found for one or more traces, for whatever reason, an additional layer or layers may be added to the electronics system. Thus, a three dimensional routing space may be used, with multiple layers of routing spaces available, each of which may contain traces. The above described processes for routing traces through a routing space may be used for each such layer, where each layer is considered a different routing space. With an insulating material between each layer, traces on one layer may cross traces on another layer. Alternatively, or in addition, traces that cannot be routed satisfactorily may simply be flagged, and other means used to route the traces, or the design of the electronics system be altered to improve routing. Possible reasons for failure to route a trace include without limitation that the length of the trace exceeds a maximum length, too many other traces were ripped up while attempting to route the trace, too much time elapsed while attempting to route the trace, the size of the priority queue exceeded a maximum threshold, the number of nodes retired exceeded a maximum threshold, etc.

The above described processes may be modified to assign the traces to be routed to one of a plurality of layers. As discussed above, data defining the components that are to be electrically connected by traces is received at step 12 of FIG. 1. Initially, a gross routing could be performed in which, for example, the traces are initially routed in a straight line from their beginning points in the routing area to their ending points. As the traces are thus routed one at a time, the traces that do not cross another trace may be assigned to a first layer. Traces that cross another trace may be assigned to a second layer. Once all of the traces have been routed, the process may be repeated with the traces assigned to the second layer, with the traces that do not cross another trace in the second layer continuing to be assigned to the second layer, while traces that cross another trace in the second layer are assigned to a third layer. This process may be repeated until all traces are assigned to a layer in which no traces cross. Thereafter, the above described processes of creating a graph, adjusting the graph, linking the graph, and routing traces through the graph may be performed on each layer. In the foregoing discussion, traces are assigned to a higher layer if they cross even one trace in their current layer. The threshold number of crossings could be increased, however, from zero to another value (e.g., 1, 2, 3, etc.) such that a trace is assigned to a higher level layer only if the trace crosses at least the threshold (nonzero) number of other traces in the current level. Of course, the number of crossings may be used alone or in combination with other factors for assigning traces to layers.

The routing space may be divided into a plurality of areas in which a particular set of design rules and/or other parameters apply in one area of the routing space and a different set of design rules and/or other parameters apply in another area of the routing space. In such a case, the parameters received at step 12 of FIG. 1, would include not only a description (e.g., the location, size, shape, and/or perimeter, etc.) of the routing space, but a description of the various areas as well. The parameters would also include a different set of design rules for each such area within the routing space. The above described processes would be modified to determine which area a particular action relates to and then apply the particular design rules that correspond to the action. For example, in creating an initial graph (step 42 of FIG. 4), the pattern, location, spacing, etc. of the nodes in the initial graph may be different in each distinct area of the routing space. As another example, in determining how many traces may pass between obstacles, the process of FIGS. 6 and 7 may determine which area or areas the space between the obstacles fall in, and calculate the number of traces accordingly. As yet another example, in applying forces to a particular node, the process of FIG. 9 may first determine which area the node falls in, and apply a particular magnitude force or forces accordingly. Likewise, the processes illustrated in FIGS. 11 and 13 may be configured to operate differently for the different areas of the routing space. All of the processes would be modified to apply the particular design rules for a given area and any particular parameters related to the design rules when operating in that area.

It should be apparent that the above described processes for creating a linked graph may be used independently of the above described processes for routing traces through a linked graph. That is, once a linked graph is created using the above described processes for creating a linked graph, routing algorithms other than the ones described above for routing traces through a linked graph may be used. Similarly, the above described processes for routing traces through a linked graph may be used independently of the above described processes for creating a linked graph. That is, the above described processes for routing traces through a linked graph may be used on linked graphs that were created using algorithms other than the ones described above for creating linked graphs. An example of such an algorithm involves creating a graph in which each node has as many as four neighbors, each at a predetermined distance and orientation with respect to the node.

It should be apparent that the above described embodiments of the invention and variations of the such embodiments may be implemented in software operating on a general or special purpose computer. Alternatively, the embodiments and variations may be implemented in specially designed hardware or a combination of software and special purpose hardware.

It should also be apparent that the embodiments and applications of the invention described herein can be used alone or in conjunction with other routing methods. As just one example, once traces have been routed in accordance with the instant invention, the traces may be adjusted or optimized as disclosed in U.S. patent application Ser. No. 09/938,895, with an attorney docket number P157-US, entitled "Process And Apparatus For Adjusting Traces," and filed concurrently with the instant application, which application is incorporated by reference herein in its entirety.

Although the principles of the present invention have been illustrated and explained in the context of specific embodiments, it will be appreciated by those having skill in the art that various modifications can be made to the disclosed embodiments without departing from the principles of the present invention. For example, rather than routing electrically conductive traces, the instant invention could be used to route microwave guides in a computer-depiction of a microwave system. Indeed, the instant invention could be used to create computer-generated paths between points in any system that can be modeled as a system through which paths need to be routed. For example, the instant invention could be used to route paths for roads, aqueducts, plumbing, pathways, etc. in traffic systems, water distribution systems, buildings, etc. Such modifications to and departures from the disclosed embodiments are deemed to be within the scope of the following claims.

What is claimed is:

1. A computer-executable process for finding a path for electrically conductive traces to be routed within a routing space, said process comprising:

receiving computer readable data comprising parameters defining said routing space, beginning and ending locations for said traces to be routed, design rules for said traces, and at least two obstacles through which said traces may not pass;

creating a graph of nodes within said routing space;

adjusting a number of nodes of said graph located between pairs of said at least two obstacles;

adjusting locations of said nodes of said graph by applying directional forces to said nodes in accordance with locations of said nodes with respect to each other and said at least two obstacles;

linking said graph by creating links between pairs of said nodes without creating links that cross; and finding paths for said traces through said linked graph by creating a plurality of path segments between nodes of said linked graph and calculating a routing cost associated with said nodes.

2. A method for finding a path within a routing space from a start location to an end location, said method comprising:

creating an initial array of nodes within said routing space;

adjusting said initial array of nodes; and selecting said path through said adjusted array of nodes, wherein said step of adjusting said initial array of nodes comprises adjusting nodes between at least a pair of obstacles in said routing space.

3. The method of claim 2, wherein said step of adjusting nodes between at least a pair of obstacles comprises:

determining a number of paths that may pass between said pair of obstacles; and adjusting a number of nodes between said pair of obstacles to be equal to said number of paths.

4. The method of claim 3, wherein said step of determining a number of paths that may pass between said pair of obstacles comprises determining a number of paths that may cross a line segment between said pair of obstacles.

5. The method of claim 4, wherein said step of adjusting a number of nodes located between said pair of obstacles to be equal to said number of paths comprises adjusting nodes along said line segment to be equal to said number of paths.

6. The method of claim 2, wherein said step of adjusting nodes between at least a pair of obstacles further comprises adjusting locations of said nodes located between said pair of obstacles.

7. The method of claim 6, wherein said step of adjusting locations of said nodes located between said pair of obstacles comprises positioning said nodes located between said pair of obstacles to correspond to permissible locations of paths between said obstacles.

8. The method of claim 2, wherein said step of adjusting said initial array of nodes further comprises:

adjusting a location of each of at least one of said nodes in accordance with a proximity of said node to an object in said routing space.

9. The method of claim 2 further comprising linking said adjusted initial array of nodes.

10. The method of claim 9, wherein said step of linking said adjusted initial array of nodes comprises creating a link between each node in said array of nodes within a predetermined proximity of said each node without crossing any of said links.

11. The method of claim 9, wherein said path traverses ones of said links.

12. A method for finding a path within a routing space from a start location to an end location, said method comprising:

creating an initial array of nodes within said routing space;

adjusting said initial array of nodes; and selecting said path through said adjusted array of nodes, wherein said step of adjusting said initial array of nodes comprises adjusting a location of each of at least one of said nodes in accordance with a proximity of said node to an obstacle in said routing space.

13. The method of claim 12, wherein said step of adjusting a location of each of at least one of said nodes in accordance with a proximity of said node to an obstacles comprises:

applying a force to said node, wherein a magnitude of said force corresponds to said proximity of said node to said obstacles; and moving said node in accordance with said force.

14. The method of claim 12, wherein said step of adjusting said initial array of nodes further comprises adjusting a location of each of at least one of said nodes in accordance with a proximity of said node to a plurality of said objects in said routing space.

15. The method of claim 14, wherein said step of adjusting a location of each of at least one of said nodes in accordance with a proximity of said node to a plurality of obstacles comprises:

applying a plurality of forces to said node, wherein a magnitude of each of said plurality of forces corresponds to said proximity of said node to one of said plurality of obstacles; and moving said node in accordance with a sum of said plurality of forces.

16. A method for finding a path within a routing space from a start location to an end location, said method comprising:

providing an array of linked nodes within said routing space, said array including a source node corresponding to said start location, a destination node corresponding to said end location, and a plurality of intermediate nodes; and determining a path from said source node to said destination node through said linked nodes, wherein said step of determining a path from said source node to said destination node comprises:

iteratively creating a plurality of partial paths, each said partial path extending to an intermediate node in said array;

determining a routing cost of each said partial path; and if more than one partial path extends to one intermediate node, discarding all of said partial paths that extend to said one intermediate node except the partial path with the lowest routing cost.

17. The method of claim 16, wherein said step of iteratively creating a plurality of partial paths comprises creating initial paths from said source node to first nodes linked to said source node.

18. The method of claim 17, wherein said step of iteratively creating a plurality of partial paths further comprises extending said initial paths from said first nodes to nodes linked to said first nodes.

19. The method of claim 16, wherein said step of providing an array of linked nodes comprises, for each node in said array, creating a link between said each node and nodes within a predetermined proximity of said each node without crossing any of said links.

20. The method of claim 16, wherein said step of providing an array of linked nodes comprises, for each node in said array, creating shortest links between said each node and nodes within a predetermined proximity of said each node without crossing any of said links.

21. The method of claim 16, wherein said step of providing an array of linked nodes comprises:

selecting one of said nodes of said array;

creating a link to another node of said array that is within a predetermined distance of said selected node; and if said created link crosses another link, deleting a longest of said crossed links.

22. The method of claim 16, wherein said step of determining a routing cost of each said partial path comprises estimating a length of a path from said source node to said destination node through the intermediate node to which said partial path extends.

* * * * *